US007371698B2

(12) United States Patent
Moriya et al.

(10) Patent No.: US 7,371,698 B2
(45) Date of Patent: May 13, 2008

(54) METHOD OF FORMING FILM PATTERN, ACTIVE MATRIX SUBSTRATE, ELECTRO-OPTIC DEVICE, AND ELECTRONIC APPARATUS

(75) Inventors: Katsuyuki Moriya, Azumino (JP); Toshimitsu Hirai, Chino (JP)

(73) Assignee: Seiko Epson Corporation (JP)

( * ) Notice: Subject to any disclaimer, the term of this patent is extended or adjusted under 35 U.S.C. 154(b) by 130 days.

(21) Appl. No.: 11/419,830

(22) Filed: May 23, 2006

(65) Prior Publication Data
US 2006/0270082 A1     Nov. 30, 2006

(30) Foreign Application Priority Data
May 24, 2005   (JP)   ............... 2005-150586

(51) Int. Cl.
*H01L 21/469*   (2006.01)
(52) U.S. Cl. ............... 438/782; 438/783; 438/780; 438/E21.114; 438/E21.174
(58) Field of Classification Search ........ 438/780–783; 257/E21.174, E21.114
See application file for complete search history.

(56) References Cited
U.S. PATENT DOCUMENTS 6,861,377 B1 * 3/2005 Hirai et al. ................. 438/781
2006/0068616 A1 * 3/2006 Shintate et al. ............ 439/76.1

FOREIGN PATENT DOCUMENTS

JP     11-274671     10/1999

* cited by examiner

*Primary Examiner*—Dung A. Le
(74) *Attorney, Agent, or Firm*—Harness, Dickey & Pierce, P.L.C.

(57) ABSTRACT

A method of forming a film pattern includes the steps of forming a bank for partitioning a pattern forming area including a first pattern forming area and a second pattern forming area having an intersection with the first pattern forming area and divided in the intersection into sub-areas, disposing a functional liquid to the first pattern forming area to form a first film pattern, and disposing a functional liquid to the sub-areas to form second film patterns, executing a lyophobic process on the entire surface of a substrate including the first film pattern, the second film patterns, and the bank, weakening the lyophobicity on the substrate while selectively maintaining the lyophobicity on predetermined positions of the respective second film patterns formed in a divided condition after executing the lyophobic process, stacking a cap layer on the first film pattern and the second film patterns after weakening the lyophobicity, removing the lyophobicity in the predetermined positions of the respective second film patterns formed in the divided condition after stacking the cap layer, and forming a conductive film between the predetermined position of one of the second film patterns and the predetermined position of another of the second film patterns to electrically connect the second film patterns formed in the divided condition.

4 Claims, 16 Drawing Sheets

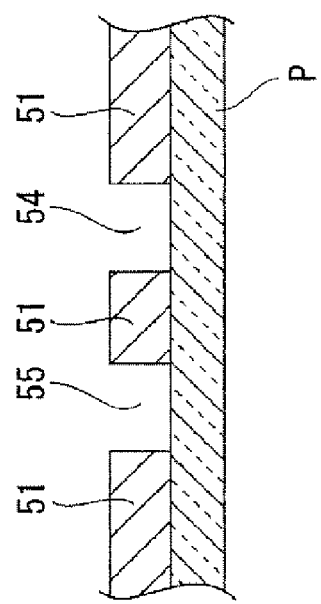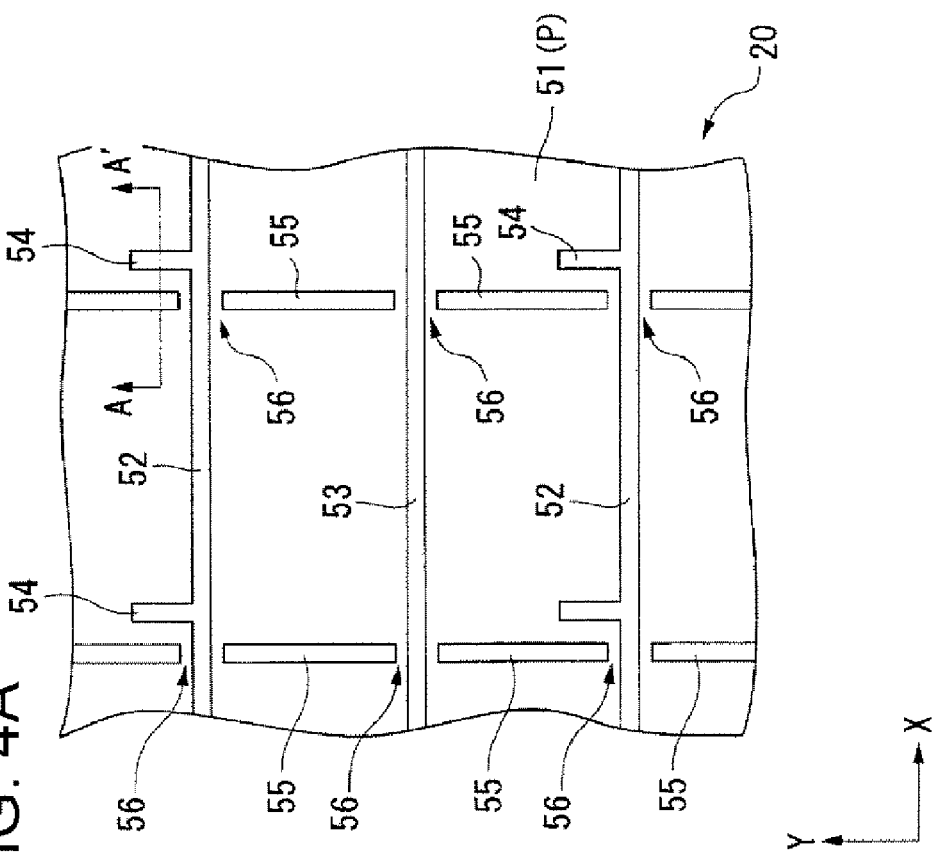

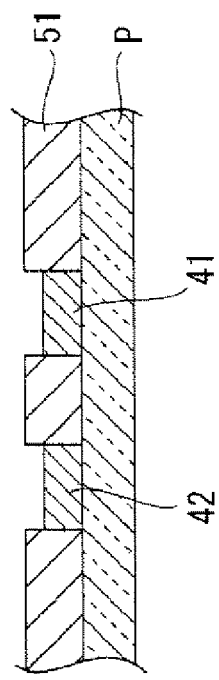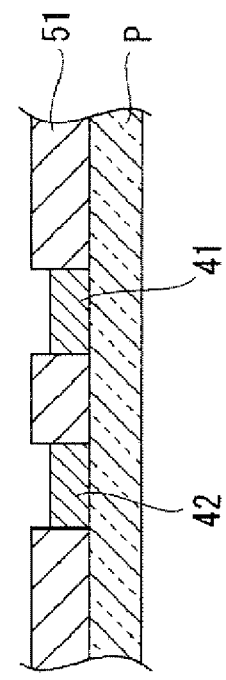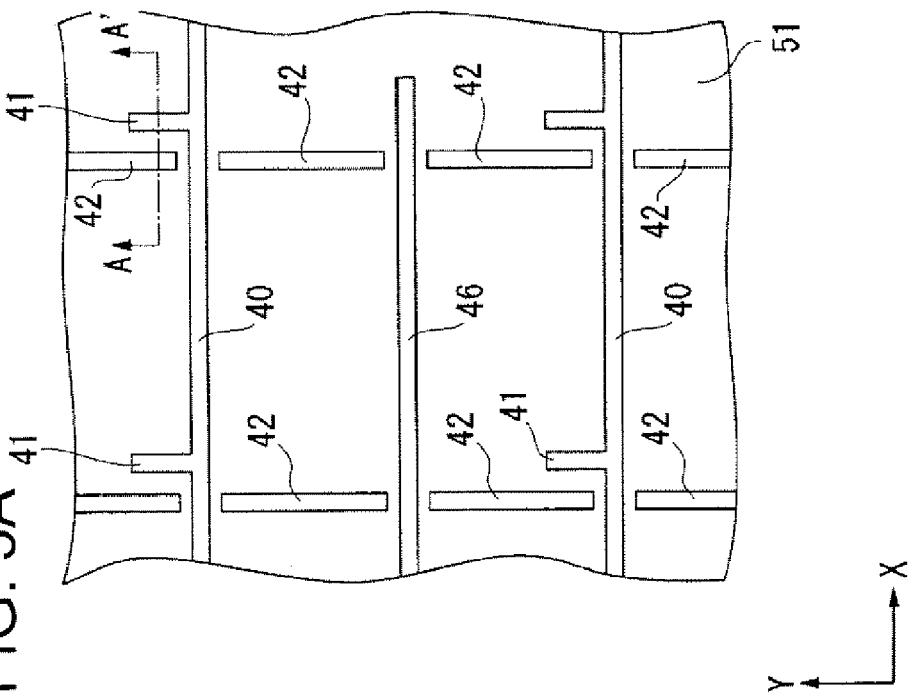

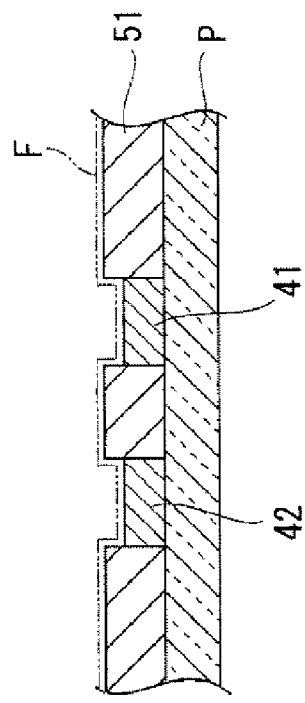
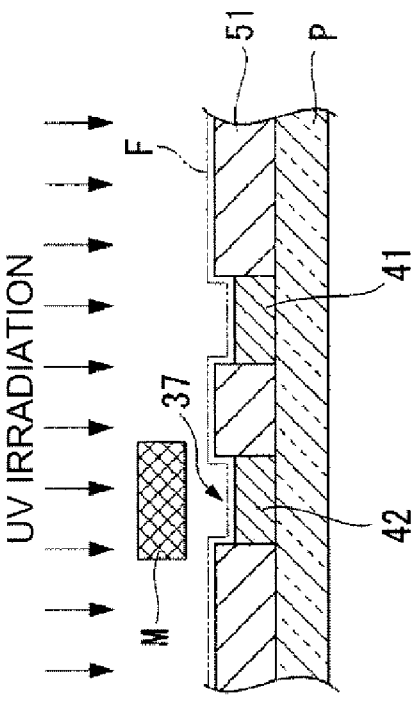
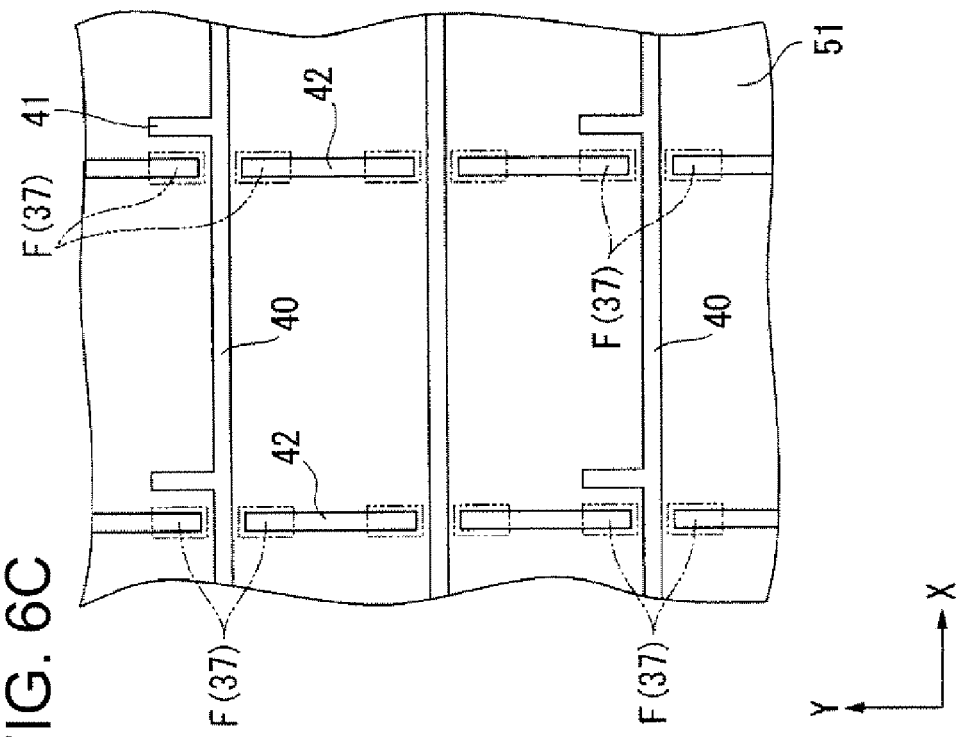

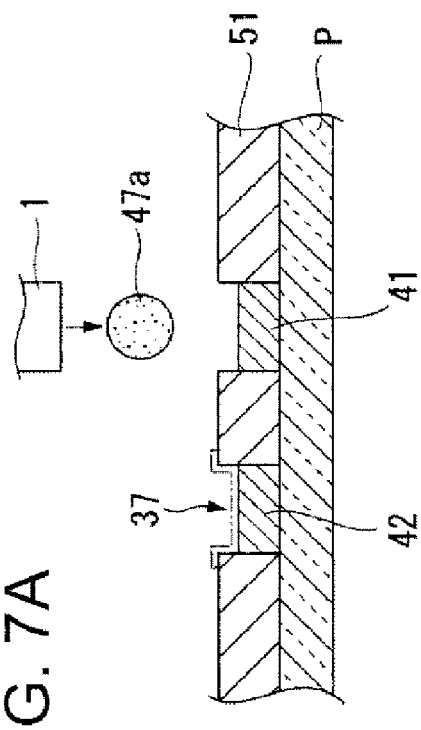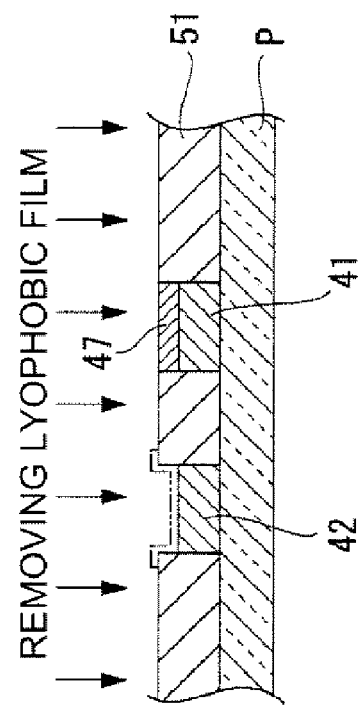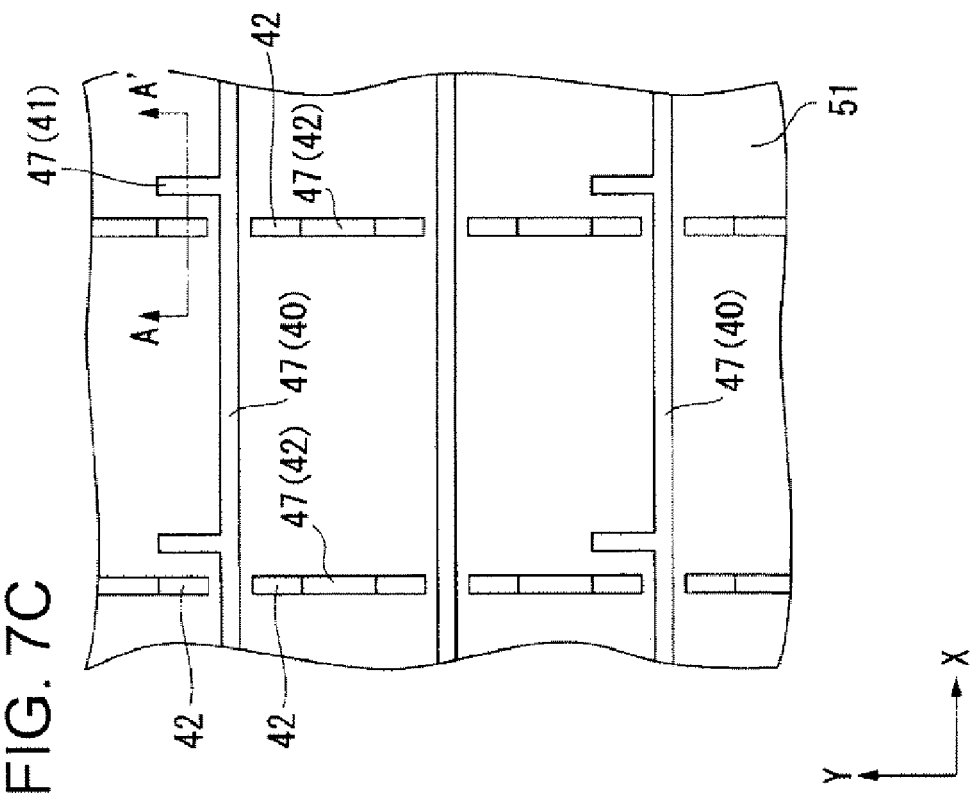
FIG. 7A
FIG. 7B
FIG. 7C

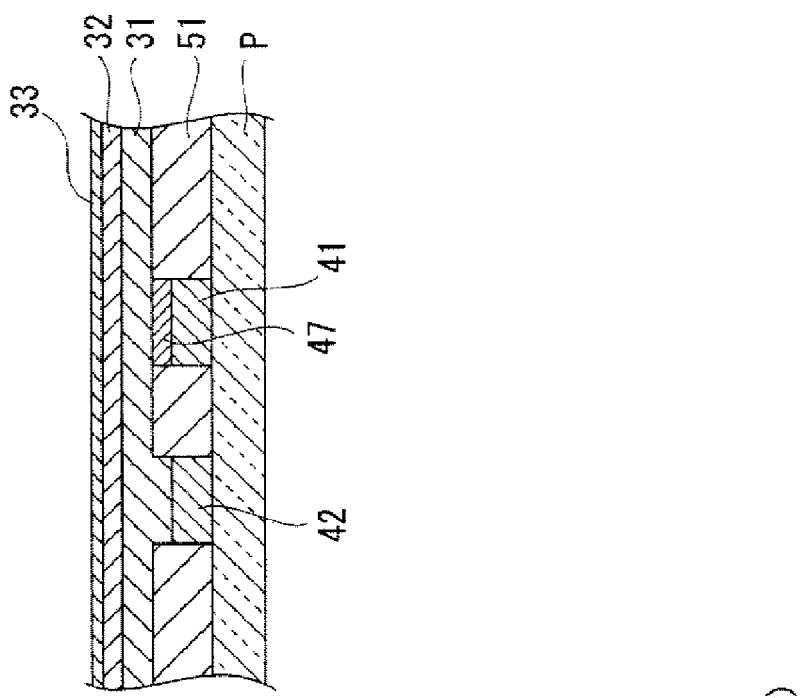
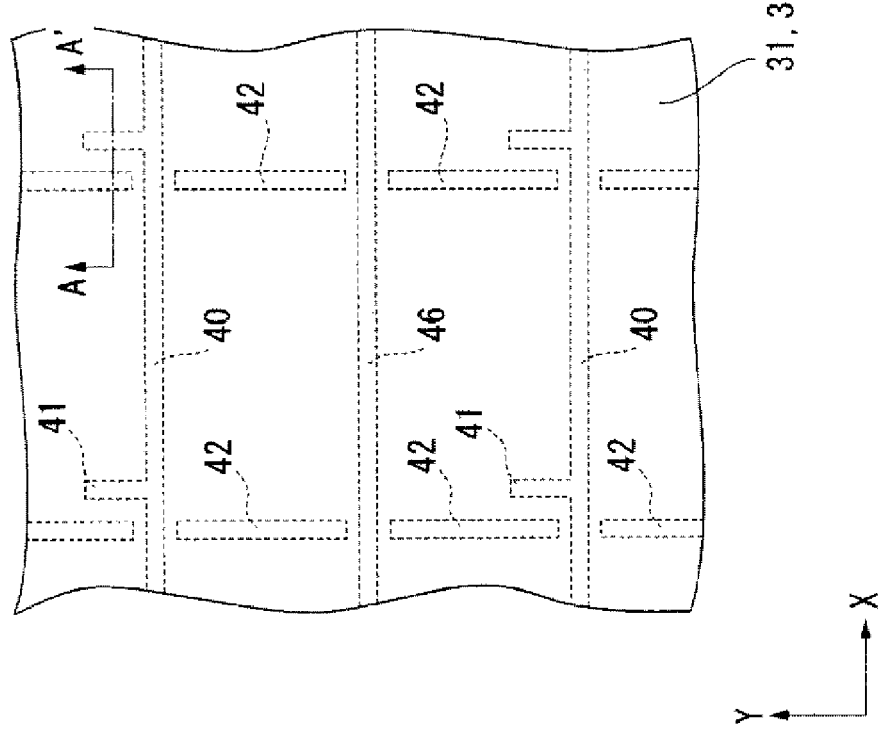

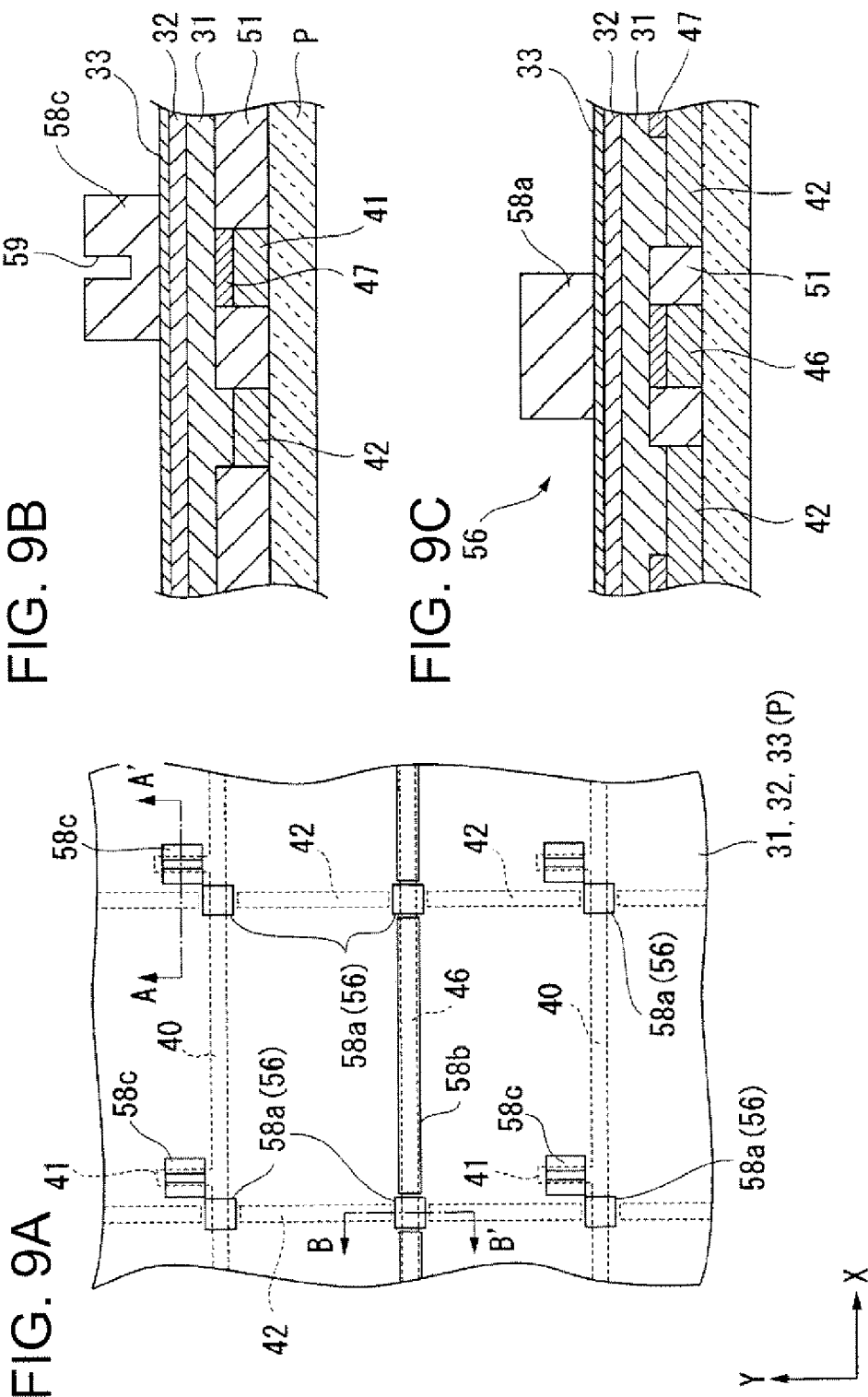

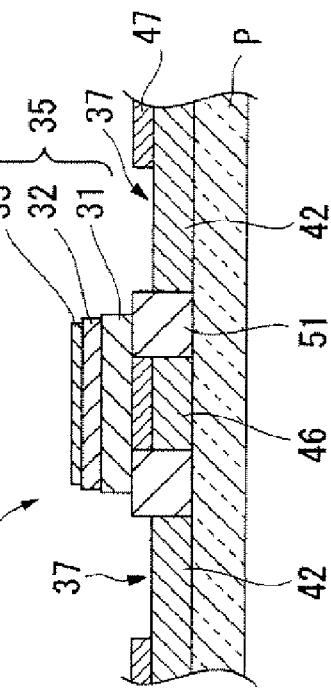
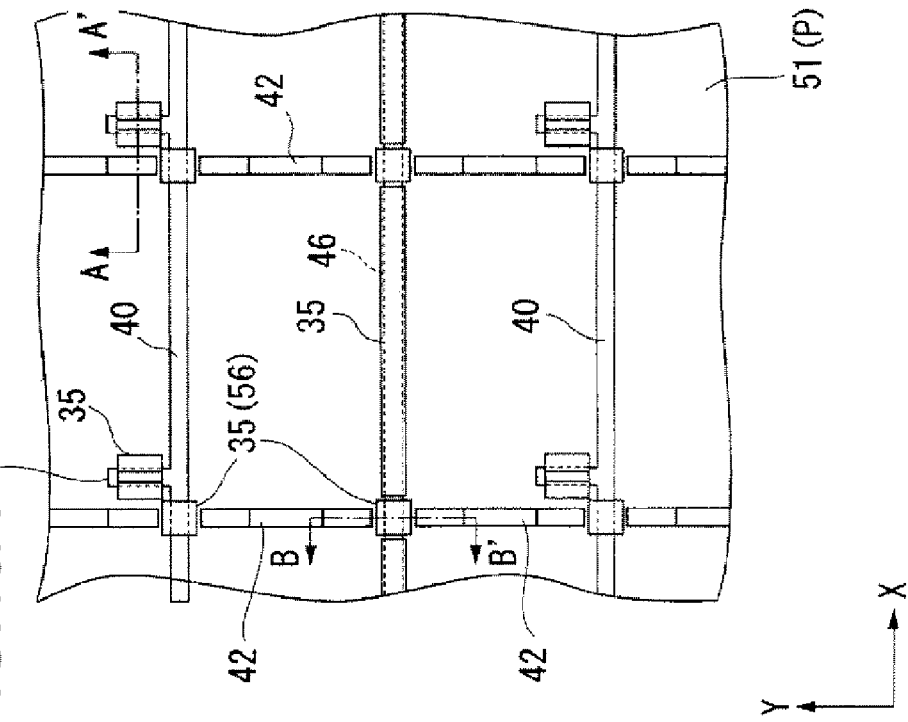

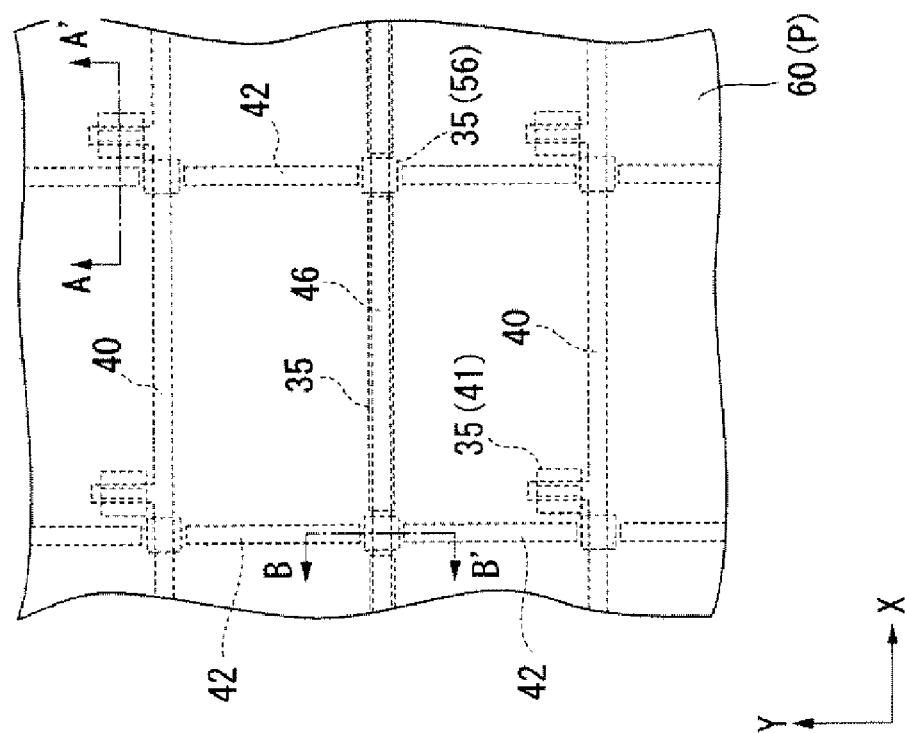
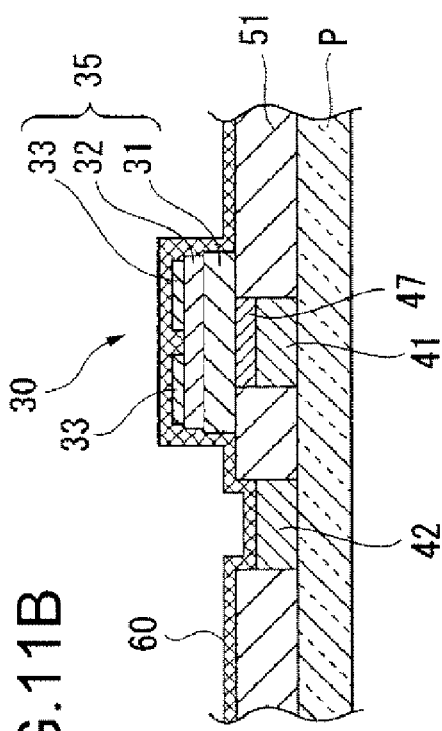
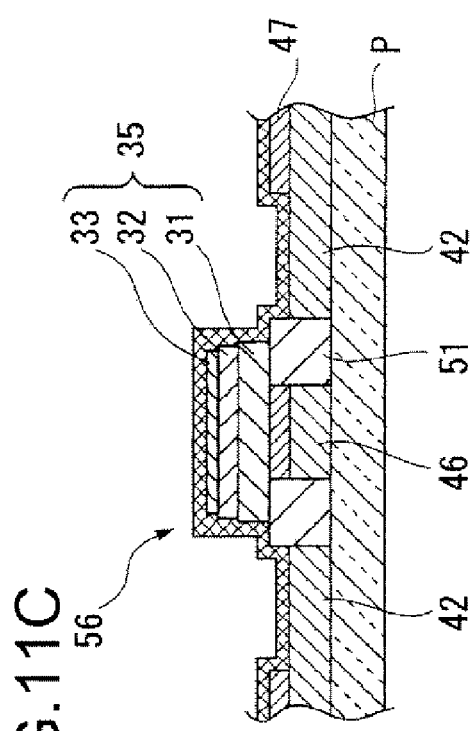

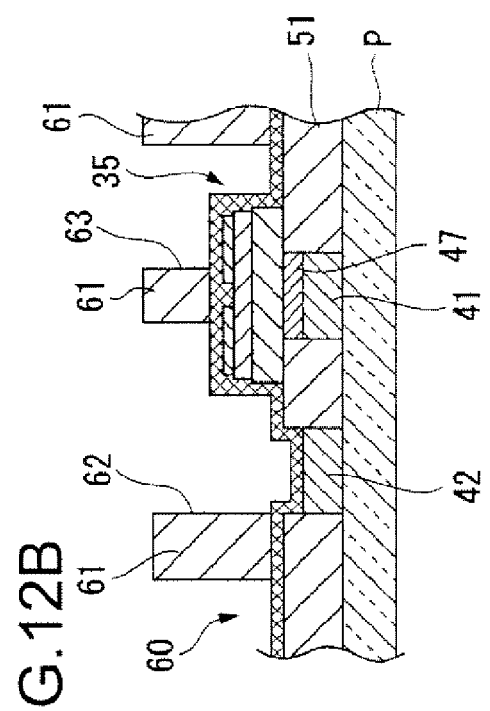
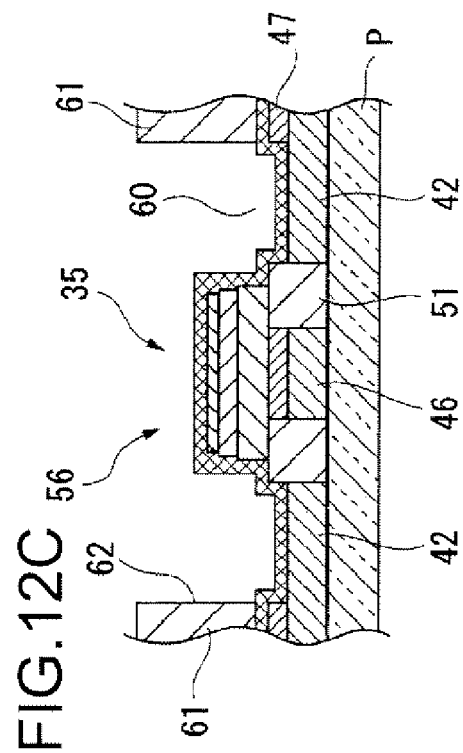
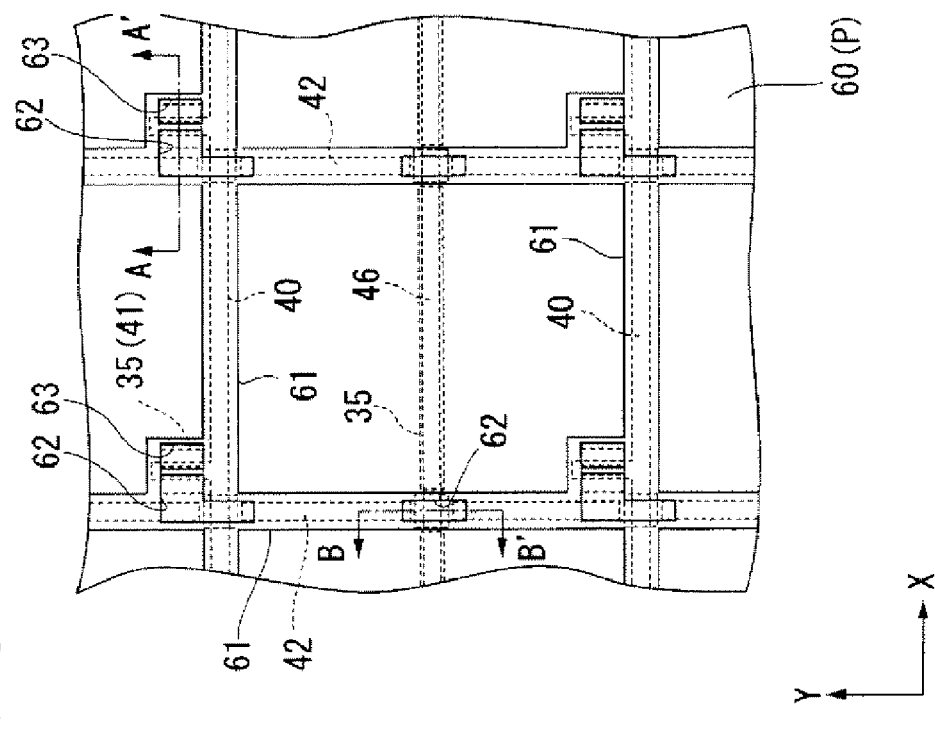
FIG.12A
FIG.12B
FIG.12C

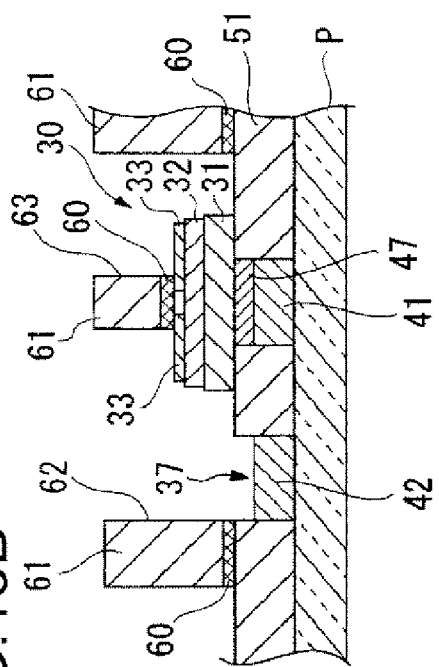
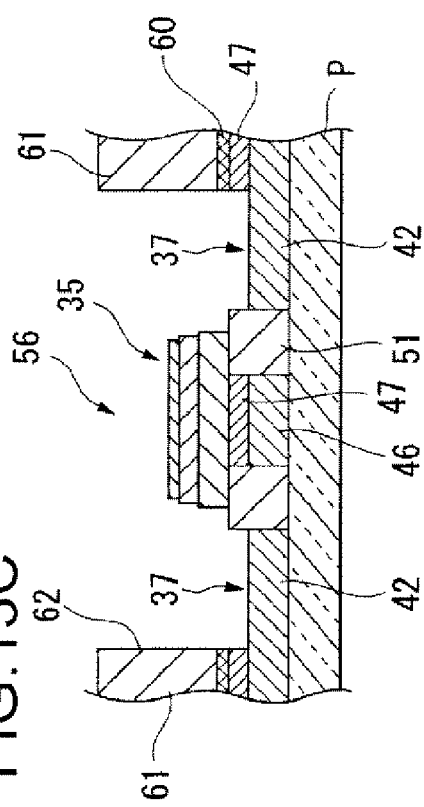
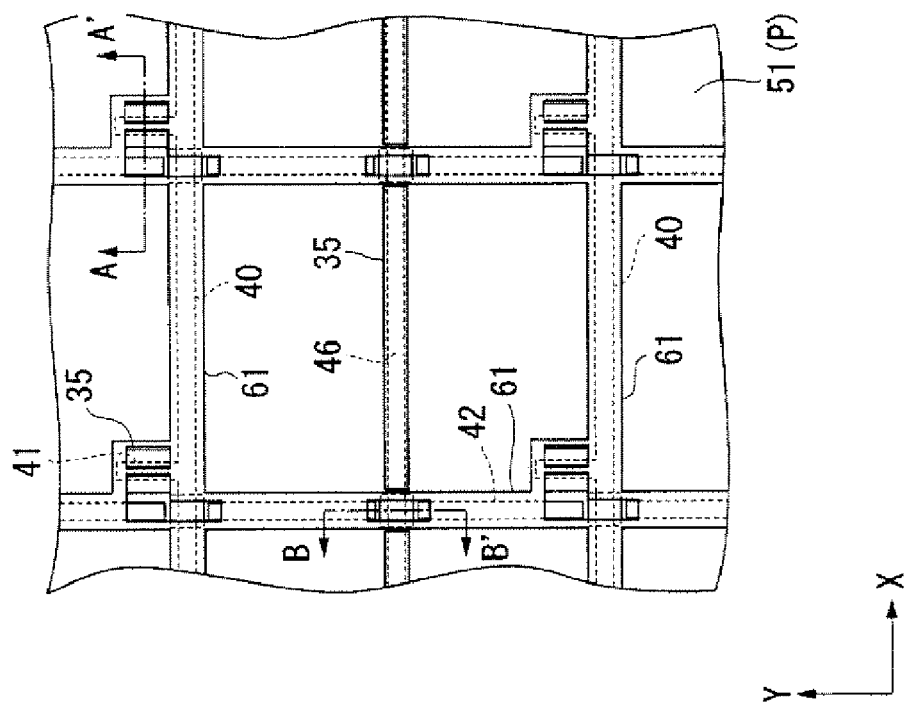

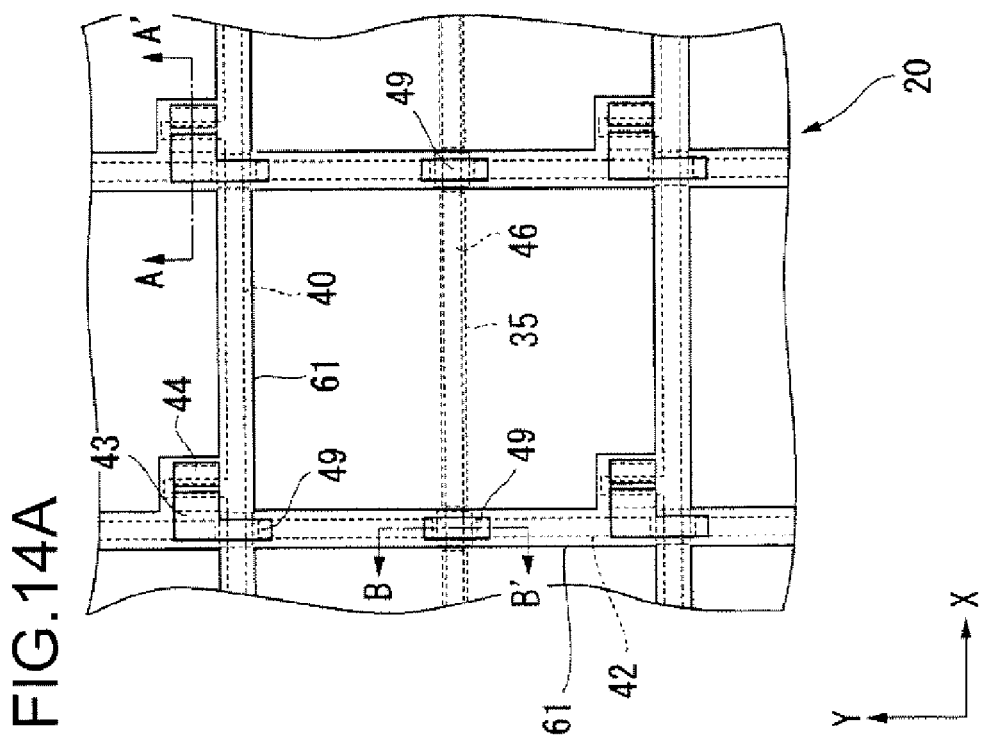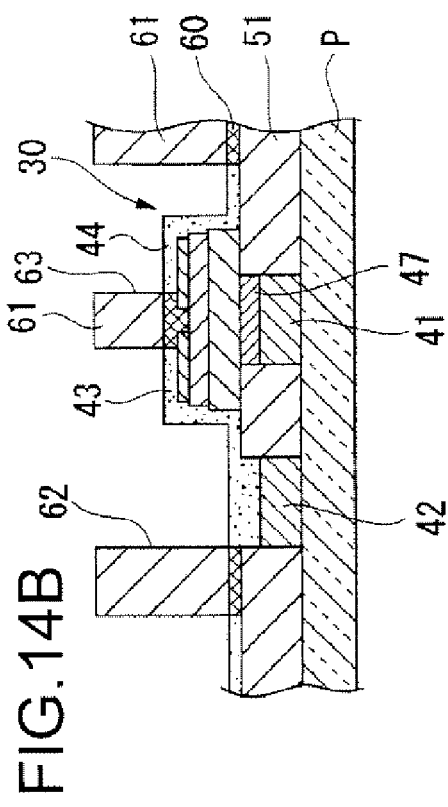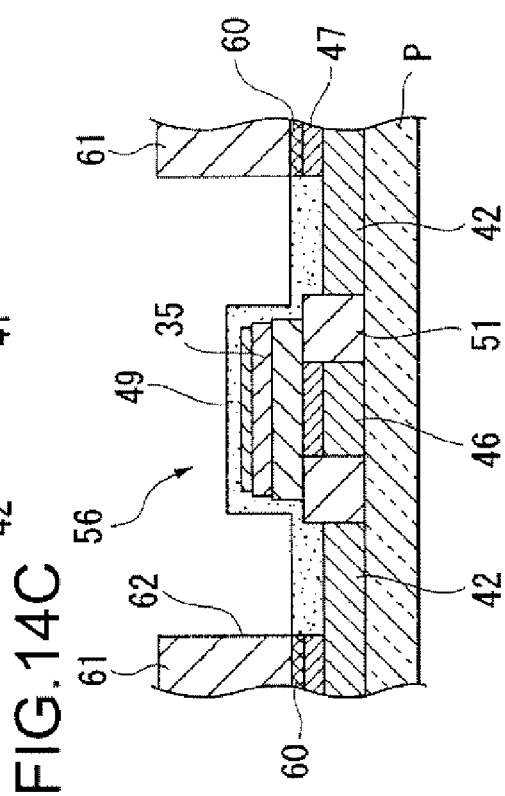

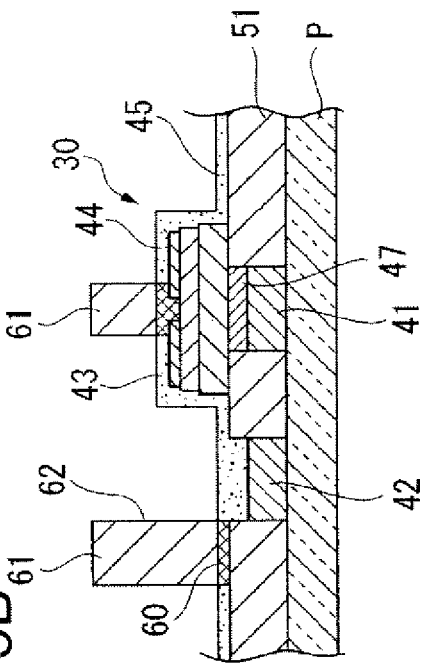
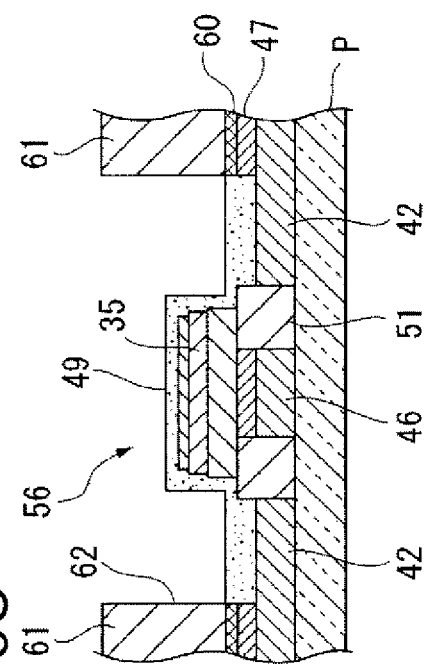
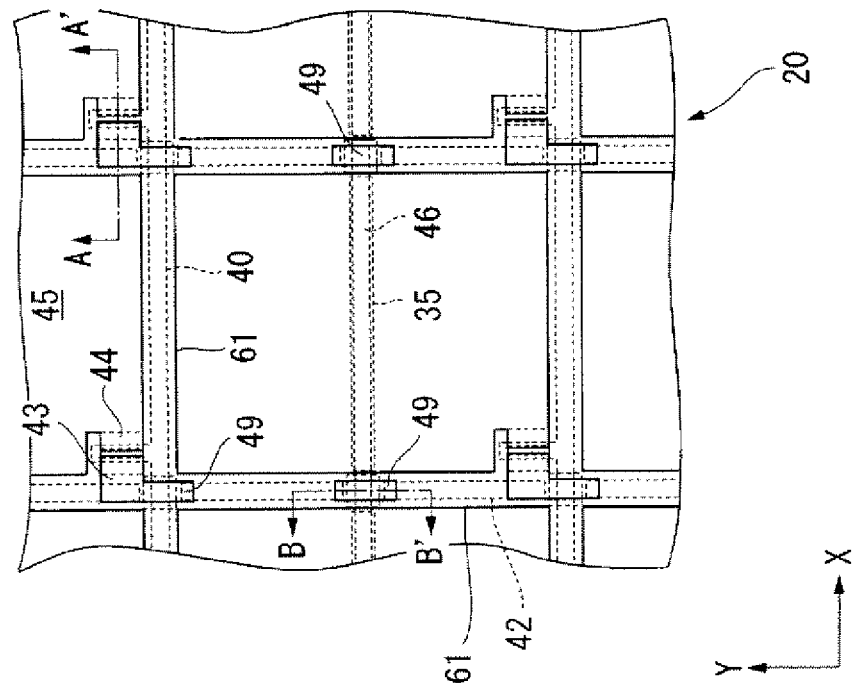
FIG.15B
FIG.15C
FIG.15A

METHOD OF FORMING FILM PATTERN, ACTIVE MATRIX SUBSTRATE, ELECTRO-OPTIC DEVICE, AND ELECTRONIC APPARATUS

BACKGROUND OF THE INVENTION

1. Technical Field

The present invention relates to a method of forming a film pattern, an active matrix substrate, an electro-optic device, and an electronic apparatus.

2. Related Art

A semiconductor device composed of a circuit wiring formed of a conductor thin film (film pattern) disposed therein, a thin film such as an insulating film covering the circuit wiring, and a thin film made of semiconductor all stacked on a substrate has been known from the past. As an efficient method of forming a thin film in such a semiconductor device, a droplet ejection method (inkjet method), in which droplets of a functional liquid containing a thin film material or the like as dispersoid is ejected from a droplet ejection head, and the landed functional liquid is dried to remove the dispersion medium thereby forming the thin film, is known to the public (see, for example, JP-A-11-274671).

In forming a film pattern by the droplet ejection method, banks for partitioning the pattern forming areas are formed, and the functional liquid is ejected towards the pattern forming areas partitioned with the banks and having recessed shapes. And, the film pattern is formed after drying the functional liquid ejected to the pattern forming areas.

In recent years, source wiring (film pattern) and gate wiring (film pattern) both electrically connected to a plurality of thin film transistors provided to an active matrix substrate are formed using the droplet ejection method described above.

The active matrix substrate is provided with the source wiring and gate wiring, which are electrically connected to each of the thin film transistors, disposed on the substrate in a lattice manner with each other, and typically has a structure in which the source wiring and the gate wiring are formed on different surfaces via an interlayer insulating film or the like.

And, since the source wiring and the gate wiring are made of metal materials, leak current might be caused by diffusion of metallic ions, which might prevent the transistor from operating preferably. Therefore, in some technologies, the diffusion of the metallic ions described above is prevented by stacking a cap layer, which is composed of Ni or the like having lower conductivity than the metal materials forming the source wiring and the gate wiring, on each wiring.

Incidentally, an active matrix substrate, which can be formed with a simplified wiring forming process of forming the gate wiring and the source wiring on the same surface in the same manufacturing process, can also be considered in contrast with the active matrix substrate having the gate wiring and the source wiring formed via the interlayer insulating film as the stacked structure. In this active matrix substrate, for example, the source wiring is formed so as to be divided by the gate wiring in intersections between the gate wiring and the source wiring. Further, the active matrix substrate is provided with conductive sections (conductive films) for connecting the source wiring thus divided.

Still further, an active matrix substrate, which is provided with the cap layer for preventing the diffusion of the metallic ions described above and has a structure of divided source wiring (film pattern), can also be considered.

However, if the cap layer is disposed on the gate wiring and the source wiring divided by the gate wiring, which are formed in the wiring forming areas (pattern forming areas) partitioned with the banks, using the droplet ejection method, the material forming the cap layer wets and extends on the wiring forming areas to form the cap layer covering the entire surface of the gate wiring and the source wiring. Note here that, as described above, the conductivity of the cap layer is lower than those of the metal materials forming the gate wiring and the source wiring. Therefore, in order for providing preferable electrical connection to the divided source wiring, it is necessary to remove the cap layer covering the source wiring to degrade the conductivity for connecting the divided source wiring by forming the conductive sections directly on the source wiring thus exposed.

However, if the process of removing the cap layer is required, as described above, in forming the conductive sections connecting between the divided pieces of the source wiring, it becomes difficult to simplify the process of forming the source wiring, thus contributing to preventing enhancement of productivity.

SUMMARY

In view of the circumstances described above, an advantage of the invention is to provide a method of forming a film pattern, an active matrix substrate, an electro-optic device, and an electronic apparatus capable of enhancing the productivity of the film pattern by simplifying steps of forming a film pattern provided with a cap layer in divided pattern forming areas.

A method of forming a film pattern according to an aspect of the invention includes the steps of forming a bank for partitioning a pattern forming area including a first pattern forming area and a second pattern forming area having an intersection with the first pattern forming area and divided in the intersection into sub-areas, disposing a functional liquid to the first pattern forming area to form a first film pattern, and disposing a functional liquid to the sub-areas to form second film patterns, executing a lyophobic process on the entire surface of a substrate including the first film pattern, the second film patterns, and the bank, weakening the lyophobicity on the substrate while selectively maintaining the lyophobicity on predetermined positions of the respective second film patterns formed in a divided condition after executing the lyophobic process, stacking a cap layer on the first film pattern and the second film patterns after weakening the lyophobicity, removing the lyophobicity in the predetermined positions of the respective second film patterns formed in the divided condition after stacking the cap layer, and forming a conductive film between the predetermined position of one of the second film patterns and the predetermined position of another of the second film patterns to electrically connect the second film patterns formed in the divided condition.

In the method of forming a film pattern according to this aspect of the invention, assuming that the conductive film for connecting the second film patterns formed in the divided condition is formed on the predetermined positions of the respective second film patterns, the lyophobicity is selectively maintained in the predetermined positions of the respective second film patterns. Therefore, when the cap layer is stacked on the first film pattern and the second film patterns, the cap layer is not formed on the predetermined positions on the second film patterns on which the lyophobicity is selectively maintained. Since the cap layer is not stacked in the predetermined positions as described above, in the case in which a conductive film for providing connection between divided second film patterns is formed, the second film patterns can electrically be connected with the conductive film without performing a step of removing the cap layer covering the film pattern to which the conductive film is to be formed.

By adopting the invention to provide connection between divided film patterns in the structure in which the film patterns are covered with a cap layer, the step of removing the cap layer from the predetermined positions for forming the conductive films can be eliminated, thus the steps of forming the film pattern can be simplified and the productivity of the film patterns can be enhanced.

Further, in the method of forming a film pattern, the weakened lyophobicity in an upper surface of the bank is preferably as strong as to at least repel a functional liquid for forming the cap layer and disposed on the bank.

According to this arrangement, if, for example, the cap layer is formed in the pattern forming area, owing to the lyophobicity remains on the bank, any functional liquid to form the cap layer landing on the bank can surely be dropped inside the pattern forming areas.

Further, in the method of forming a film pattern, a material for forming the bank preferably includes an inorganic material composed principally of one of polysilazane, polysilane, and polysiloxane as solid content.

According to this arrangement, since the bank forming material is composed mainly of either of polysilazane, polysilane, or polysiloxane as solid content, thermal resistance can be improved in comparison with a bank made of an organic material, and it is particularly preferable when the functional liquid disposed between the banks is calcined to form a film pattern.

Further, in the method of forming a film pattern, in the lyophobic process, a self-assembly film is preferably formed on the entire surface of the substrate including the first film pattern, the second film patterns, and the bank.

If the plasma process is performed as the process for providing lyophobicity to the surface of the substrate, the first film pattern and the second film patterns as the foundation are damaged by the plasma. Therefore, by attaching, for example, fluoroalkylsilane to the entire surface of the substrate, each of the compounds is oriented so that the fluoroalkyl group positions on the surface of the film to form the self-assembly film, thus the even lyophobicity can be provided on the surface of the film. Since the lyophobic process is thus carried out by forming the self-assembly film, damages to the first film pattern and the second film patterns can be eased.

An active matrix substrate according to another aspect of the invention includes a gate wiring pattern electrically connected to a thin film transistor and composed of the first film pattern formed by the method of forming a film pattern described above and a source wiring pattern electrically connected to the thin film transistor and composed of the second film patterns formed by the method of forming a film pattern described above.

According to the active matrix substrate of this aspect of the invention, by forming the source wiring pattern in a divided condition, a structure can be made possible in which the gate wiring and the source wiring are formed in plain with each other. In this case, as described above, the steps of forming the source wiring connected to the thin film transistor by electrically connecting the divided wiring patterns with a conductive film can be simplified, accordingly, the productivity of the active matrix substrate itself can also be enhanced.

An electro-optic device according to another aspect of the invention includes the active matrix substrate described above.

According to the electro-optic device of this aspect of the invention, since the active matrix substrate with high productivity is implemented, the productivity of the electro-optic device itself is also improved, and accordingly, cost reduction can be expected.

An electronic apparatus according to another aspect of the invention includes the electro-optic device described above.

According to the electronic apparatus of this aspect of the invention, since the electro-optic device with high productivity and reduced cost is implemented, the electronic apparatus itself equipped with the electro-optic device also becomes to have high productivity and reduced cost.

BRIEF DESCRIPTION OF THE DRAWINGS

The invention will now be described with reference to the accompanying drawings, wherein like numbers refer to like elements.

FIGS. 4A and 41B are schematic views showing a procedure of manufacturing an active matrix substrate.

FIGS. 5A through 5C are schematic views showing a procedure following FIGS. 4A and 4B.

FIGS. 6A through 6C are schematic views showing a procedure following FIGS. 3A through 5C.

FIGS. 7A through 7C are schematic views showing a procedure following FIGS. 6A through 6C.

FIGS. 8A and 8B are schematic views showing a procedure following FIGS. 7A through 7C.

FIGS. 9A through 9C are schematic views showing a procedure following FIGS. 8A and 8B.

FIGS. 10A through 10C are schematic views showing a procedure following FIGS. 9A through 9C.

FIGS. 11A through 11C are schematic views showing a procedure following FIGS. 10A through 10C.

FIGS. 12A through 12C are schematic views showing a procedure following FIGS. 11A through 11C.

FIGS. 13A through 13C are schematic views showing a procedure following FIGS. 12A through 12C.

FIGS. 14A through 14C are schematic views showing a procedure following FIGS. 13A through 13C.

FIGS. 15A through 15C are schematic views showing a procedure following FIGS. 14A through 14C.

DESCRIPTION OF THE EMBODIMENTS

A method of forming a film pattern, an active matrix substrate, an electro-optic device, and an electronic apparatus according to embodiments of the invention will hereinafter be explained with reference to the accompanying drawings. Note here that, in each of the drawings, contraction scales of layers and parts may be different so as to have recognizable sizes on each of the drawings.

Figure 1:
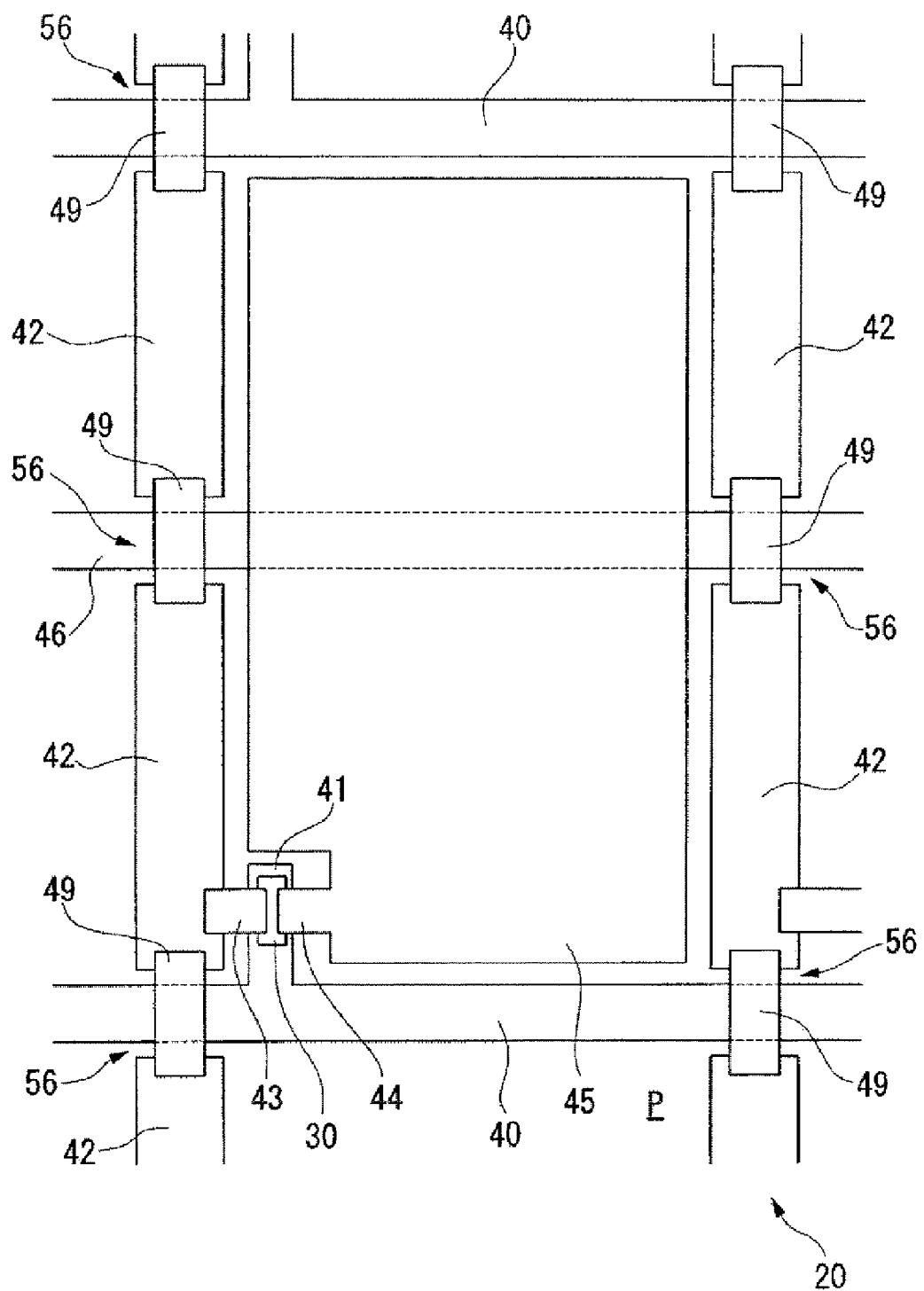
FIG. 1 is a partial enlarged view of an active matrix substrate.

FIG. 1 is an enlarged plan view showing a schematic configuration of a part of an active matrix substrate 20 provided with a gate wiring (a first film pattern) 40, a source wiring (a second film pattern) 42, and a capacitance lines (the first film pattern) 46.

The active matrix substrate 20 is provided with a plurality of gate wiring patterns 40 and a plurality of source wiring patterns 42 arranged on a substrate P in a lattice manner. And, the capacitance lines 46 are formed on the substrate P substantially in parallel to the gate wiring pattern 40. Note that the gate wiring 40, the source wiring 42, and the capacitance line 46 is formed on the same surface of the active matrix substrate 20.

In the active matrix substrate 20 according to the present embodiment, the source wiring pattern 42 is formed in a condition divided by the gate wiring pattern 40 and the capacitance lines 46. And, the end sections of the source wiring patterns 42 divided by the gate wiring pattern 40 and the capacitance lines 46 are provided with conductive films 49 so as to function as if the source wiring pattern 42 is formed continuously. The conductive films 49 are formed, as described below, above the gate wiring 40 via an insulating layer, and accordingly, in a condition keeping the source wiring isolated from the gate wiring 40 and the capacitance lines 46.

Further, although a metal protecting layer (cap layer) is formed by a manufacturing process described below so as to cover the gate wiring 40, the source wiring 42, and the capacitance lines 46, respectively, it is not shown in FIG. 1.

Further, a gate electrode 41 is connected to the gate wiring 40, and a TFT 30 is formed above the gate electrode 41 via an insulating layer (not shown). Incidentally, a source electrode 43 is connected to the source wiring 42, and one end of the source electrode 43 is connected to the TFT 30.

And, a pixel electrode 45 is connected to an area surrounded by the gate wiring 40 and the source wiring 42, and further connected to the TFT 30 via a drain electrode 44.

Now, an embodiment of forming the gate wiring 40 and the source wiring 42, which are electrically connected to the TFT 30 formed on the active matrix substrate 20, using the film pattern forming method according to the invention will be explained.

Meanwhile, in the present embodiment, the droplet ejection method (inkjet method) is used as a method of disposing the wiring pattern ink (functional liquid) for forming the gate wiring 40, the source wiring 42, and the capacitance lines 46, and the metal protecting layer forming material (functional liquid) for composing the metal protecting layer formed on these wiring patterns. By using the droplet ejection method as described above, advantages can be obtained that the waste in consuming the liquid material is fewer compared to other coating technologies such as spin coating method, and that the amount and the position of the functional liquid disposed on the substrate can easily be controlled.

Note here that, as a ejection technology used for the droplet ejection process, the charge control method, the pressure vibration method, electromechanical conversion method, electrothermal conversion method, electrostatic absorption method, and so on can be cited. In the charge control method, the material is electrically charged by a charge electrode and ejected from an ejection nozzle while its flight orientation is controlled by a deflection electrode. Further, in the pressure vibration method, the material is ejected from the tip of the ejection nozzle by being applied with very high pressure of about 30 kg/cm$^2$, and when no control voltage is applied, the material is forwarded straight to be ejected from the ejection nozzle, and when the control voltage is applied, an electrostatic repelling force is generated in the material to cause the material to fly in various directions and not to be ejected from the ejection nozzle. Further, in the electromechanical conversion method, the characteristics of the piezoelectric element that distorts in response to a pulsed electric signal are utilized, and when the piezoelectric element distorts, pressure is applied to a chamber containing the material via an elastic member to push the material out of the chamber to eject it from the ejection nozzle.

Further, in the electrothermal conversion method, the material is rapidly vaporized to generate a bubble by a heater provided in a chamber containing the material, and the material in the chamber is ejected by a pressure caused by the bubble. In the electrostatic absorption method, minute pressure is applied to a chamber containing the material to form a meniscus at the ejection nozzle, and then electrostatic absorption force is applied in this condition to take the material out of the nozzle. Other than the above methods, a method utilizing viscosity alteration of fluid by electric field or a method for flying the material by discharge sparks can also be adopted. The droplet ejection method has advantages that there is little waste in using the material and that a desired amount of material can precisely be disposed on a desired position. Note that the weight of one droplet of the liquid material (fluid) ejected by the droplet ejection method is, for example, 1 through 300 nanograms.

In the present embodiment, the electromechanical conversion type of droplet ejection device (inkjet device) using the piezo element (the piezoelectric element) is used as such a device as performing droplet ejection.

Figure 2:
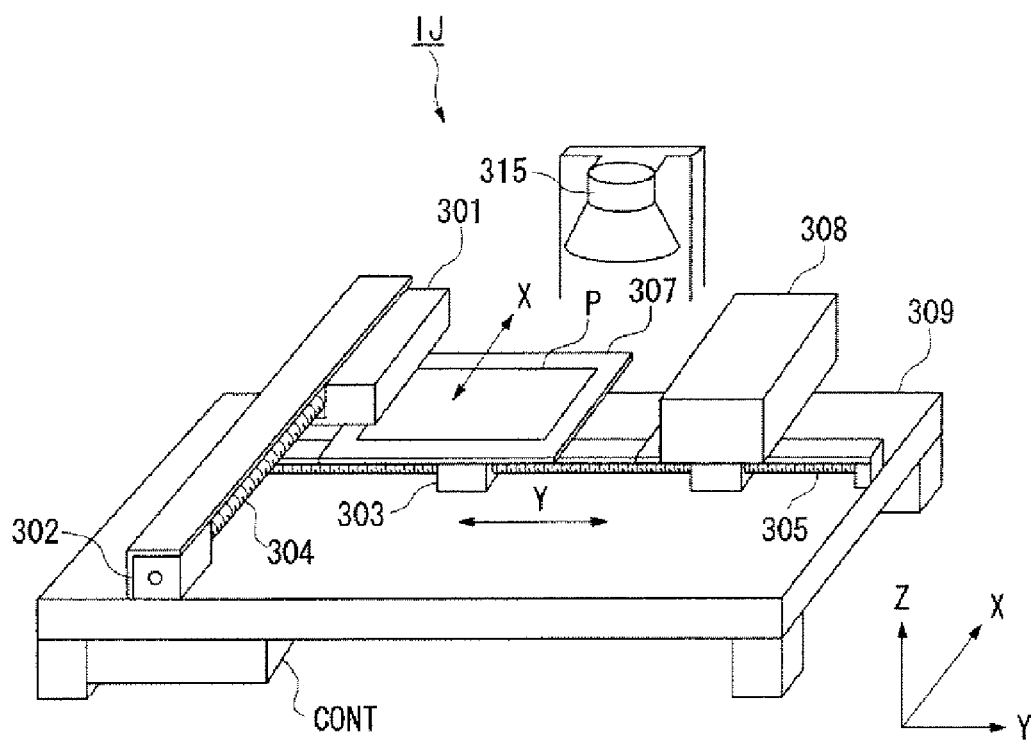
FIG. 2 is a schematic perspective view of a droplet ejection device.

FIG. 2 is a perspective view schematically showing the configuration of the droplet ejection device IJ.

The droplet ejection device IJ includes a droplet ejection head 301, a driving shaft 4 in the X-axis direction, a guiding shaft 305 in the Y-axis direction, a controller CONT, a stage 307, a cleaning mechanism 308, a base 309 and a heater 315.

The stage 307 is for supporting the substrate P to which the wiring pattern ink (functional liquid) is disposed by the droplet ejection device IJ, and is equipped with a fixing mechanism not shown for fixing the substrate P to a reference position. Note that the substrate P is for forming the active matrix substrate 20.

The droplet ejection head 301 is provided with a plurality of ejection nozzles as a multiple-nozzles type and its longitudinal direction is coincided with the X-axis direction. The plurality of ejection nozzles is provided on the lower surface of the droplet ejection head 301 at constant intervals. It is arranged that the ink for forming the wiring pattern containing the conductive fine particles described above is ejected from the ejection nozzles of the droplet ejection head 301 to the substrate P supported by the stage 307.

The driving shaft 304 in the N-axis direction is coupled to a driving motor 302 in the X-axis direction. The driving motor 302 in the X-axis direction is composed of a stepping motor and the like that drives the driving shaft 304 in the X-axis direction when a driving signal in the X-axis direction is supplied from the controller CONT. When the driving shaft 304 in the X-axis direction rotates, the droplet ejection head 1 moves in the X-axis direction.

The guiding shaft 305 in the Y-axis direction is fixed so as not to move relatively to the base 309. The stage 7 is provided with a driving motor 3 in the Y-axis direction. The driving motor 303 in the Y-axis direction is a stepping motor or the like that moves the stage 7 in the Y-axis direction when a driving signal in the Y-axis direction is supplied from the controller CONT.

The controller CONT supplies the droplet ejection head 1 with voltages for controlling ejection of droplets. Further, the controller supplies a driving pulse signal to the driving motor 302 in the X-axis. This driving pulse signal controls the movement of the droplet ejection head 1 in the X-axis direction. The controller also supplies a driving pulse signal to the driving motor 303 in the Y-axis. This driving pulse signal controls the movement of the stage 7 in the Y-axis direction.

The cleaning mechanism 308 is for cleaning the droplet ejection head 301. The cleaning mechanism 308 is provided with a driving motor in the Y-axis direction not shown in the drawings. The driving motor in the Y-axis direction moves the cleaning mechanism along the guiding shaft 305 in the Y-axis direction. The movement of the cleaning mechanism 308 is also controlled by the controller CONT.

The heater 315 is a unit for performing a heat process on the substrate P using a lamp annealing process, and evaporates the solvent included in the solution applied on the substrate P to dry the substrate P. The controller CONT also controls turning on and off the power supply to the heater 315.

The droplet ejection device IJ is arranged to eject droplets to the substrate P from the plurality of ejection nozzles, which are arranged in the lower surface of the droplet ejection head 1, in the X-axis direction while scanning the droplet ejection head 1 and the stage 307 supporting the substrate P relatively to each other.

In this case, the wiring pattern ink (functional liquid) used in the present embodiment is composed of a dispersion liquid containing conductive fine particles dispersed in a dispersion medium. Besides metal fine particles including at least one of, for example, gold, silver, copper, aluminum, chromium, manganese, molybdenum, titanium, palladium, tungsten, and nickel, oxides thereof, fine particles of electrically conductive polymers or superconductive materials can be used as the conductive fine particles. An organic matter can be applied on the surface of these conductive micro particles in order to improve dispersibility. The diameter of each of the conductive fine particles is preferably in a range of 1 nm through 0.1 μm. If the particle diameter is greater than 0.1 μm, clogging may occur in the ejection nozzles of the droplet ejection head described below. Further, if it is smaller than 1 nm, the volume ratio of the coating agent with respect to the conductive fine particles becomes larger, the ratio of the organic matters in the resulting film becomes too large.

The dispersion medium is not particularly limited providing it can disperse the conductive fine particles described above and does not cause any agglutinations. For example, other than water, alcohol such as methanol, ethanol, propanol, or butanol, carbon hydride compounds such as n-heptane, n-octane, decane, dodecane, tetradecane, toluene, xylene, cymene, durene, indene, dipentene, tetrahydronaphthalene, decahydronaphthalene, or cyclohexylbenzene, etherates such as ethyleneglycoldimethylether, ethyleneglycoldiethylether, ethyleneglycolmethylethylether, diethyleneglycoldimethylether, diethyleneglycoldiethylether, diethylene glycolmethylethylether, 1,2-dimethoxyethane, bis(2-methoxyethyl)ether, or p-dioxane, and further polar compounds such as propylene carbonate, a-butyrolactone, N-nethyl-2-pyrrolidone, dimethylformamide, dimethylsulfoxide, or cyclohexanone can be exemplified. In the above compounds, in view of dispersibility of the fine particles and stability of the dispersion liquid, further facility of applying to the droplet ejection method, water, alcohol, carbon hydride compounds, and etherates are preferable, and as a more preferable dispersion medium, water and carbon hydride compounds can be cited.

The surface tension of the solution including conductive fine particles is preferably in a range of no smaller than 0.02 N/m and no greater than 0.07 N/m. When the ink is ejected using the droplet ejection process, the surface tension of less than 0.02 N/m easily causes the curved flight because the wettability of the nozzle surface to the ink is increased, on the one hand, and the surface tension of greater than 0.07 N/m makes it difficult to control the ejection amount or the ejection timing because the shapes of the meniscuses in the nozzle tips are not stabilized, on the other hand. In order to arrange the surface tension, a small amount of materials for arranging the surface tension such as fluorine materials, silicon materials, nonionic materials can preferably be added to the liquid material as long as it can prevent the contact angle with the surface of the substrate from decreasing dramatically. The nonionic surface tension adjustment agent enhances wettability of the ink to the substrate, improves the leveling property of the film, and works for preventing microscopic unevenness of the film from occurring. The materials for arranging the surface tension can include organic compounds such as alcohol, ether, ester and ketene according to needs.

The viscosity of the solution is preferably no smaller than 1 mPa·s and no greater than 50 mPa·s. When the ink is ejected as the droplets using the droplet ejection process, the viscosity of less than 1 mPa·s easily causes contamination in the periphery of the nozzles with the outflow of the ink, and the viscosity of greater than 50 mPa·s increases the frequency of the clogging in the nozzle holes, thus making the smooth ejection of the droplets difficult.

Figure 3:
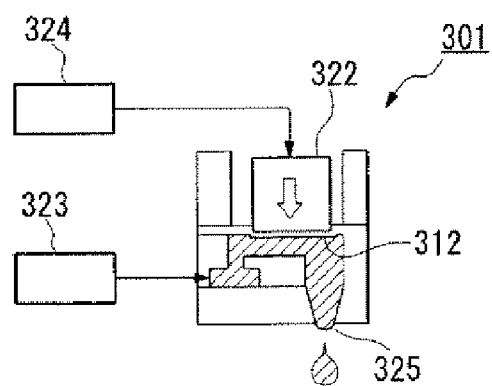
FIG. 3 is a cross-sectional view of a droplet ejection head.

FIG. 3 is a schematic view for explaining the principle of ejection of the liquid material according to the piezoelectric method.

In FIG. 3, a piezo element 322 is placed adjacent to a liquid chamber 21 for storing the liquid material (the ink for forming the wiring pattern, a functional liquid). The liquid material is supplied to the liquid chamber 312 via a liquid material supplying system 323 including a material container for storing the liquid material. The piezo element 322 is connected to a drive circuit 24, and by applying voltage to the piezo element 322 via the drive circuit 24 to distort the piezo element 322, the liquid chamber 312 is also distorted to eject the liquid material from the ejection nozzle 325. In this case, the amount of the distortion of the piezo element 322 is controlled by changing the value of the applied voltage. Further, the speed of the distortion of the piezo element 322 is controlled by changing the frequency of the applied voltage. A droplet ejection method with the piezo method has an advantage that bad effects are hardly applied to the material compositions since the materials are not heated.

A method of forming the active matrix substrate 20 including a TFT 30 electrically connected to the gate wiring 40 and the source wiring 42 covered with the metal protecting layer by disposing the wiring pattern ink and the metal protecting layer forming material using the droplet ejection device IJ described above will hereinafter be explained.

FIGS. 4A, 4B, and 5A through 5C are schematic views for explaining the process of forming the source wiring and the gate wiring. Note that FIGS. 4B and 5B are cross-sectional views along the A-A' lines in FIGS. 4A and 5A, respectively.

Firstly, in forming the banks for partitioning areas to which the functional liquid is ejected, banks 51 made of an insulating material are formed on the substrate P. The banks 51 are for positioning the wiring pattern ink described later in the predetermined positions on the substrate P.

Note here that various materials such as glass, quartz glass, a Si wafer, a plastic film, a metal plate, and so on can be adopted as the substrate P as desired. Further, the substrates formed of these various materials provided with a semiconductor film, a metal film, a dielectric film, or an organic film on the surfaces thereof as a foundation layer can also be adopted.

As shown in FIG. 4A, the banks 51 partitioning the pattern forming areas, which include gate wiring forming areas (a first pattern forming areas) 52, source wiring forming areas (a second pattern forming areas) 55, capacitance line forming areas (the first pattern forming areas) 53, gate electrode forming areas 54 formed contiguous to the gate wiring forming areas 52, are formed on the substrate P, which is cleaned, based on a photolithography method.

Specifically, as shown in FIG. 4A, the source wiring forming areas 55 are formed extending in the X direction, while the gate wiring forming areas 52 are formed extending in the Y direction, thereby arranging the source wiring forming areas and the gate wiring forming areas are orthogonal to each other. Further, the capacitance line forming areas 53 are disposed substantially in parallel to the gate wiring forming areas 52, and are formed extending in the X direction. And, the source wiring forming areas 55 are in divided conditions in intersections with the gate wiring forming areas 52 or the capacitance line forming areas 53.

As a method of forming the banks 51, any methods such as lithography method can be used. For example, if the lithography method is used, a layer made of the bank forming material is formed on the substrate P with a predetermined method such as a spin coating method, a spray coating method, a roll coating method, a dye coating method, a dip coating method, and so on, and then the layer is patterned, thereby obtaining the banks with predetermined patterns. Note that the banks can be formed on a different substance form the substrate P, and then transferred on the substrate P.

As the bank forming material for composing the banks 51, for example, a polymeric material such as acrylic resin, polyimide resin, olefin resin, or melamine resin can be used. Further, in consideration of thermal resistance and so on, it can include an inorganic material. As the inorganic bank material, for example, a polymer inorganic material or a photosensitive inorganic material including silicon in its framework such as polysilazane, polysiloxane, a siloxane-group resist, or polysilane-group resist, a spin-on-glass film including either one of silica glass, alkylsiloxane polymer, alkylsilsesquioxane polymer, alkylsilsesquioxane hydride polymer, or polyarylether, a diamond film, a fluorinated amorphous carbon film, and so on can be cited. Further, as the inorganic material for forming the bank, for example, aerogel, porous silica, and so on can also be used. A material having photosensitivity such as a polysilazane composition including polysilazane and either one of a photoacid generator and a photobase generator is preferable because the resist mask can be eliminated. As the material for composing the banks 51 of the present embodiment, an inorganic material composed principally of polysilazane is used. Accordingly, since the resulted banks 51 becomes inorganic and is composed mainly of polysilazane, the banks 51 has higher thermal resistance in comparison with an organic bank made of an organic material, and moreover, the difference in the coefficient of thermal expansion between the banks and the substrate can be reduced. Therefore, the degradation of the banks 51 by the heat in drying the ejected functional liquid can be prevented, thus the preferable film pattern can be formed.

Note that the banks 51 can be treated with a lyophobic process on the upper surface thereof in order for preferably disposing the wiring pattern ink in the respective wiring forming areas 52, 53, 54, and 55. As such a lyophobic process, for example, $CF_4$ plasma process and so on (a plasma process with a gas containing a fluorine component) is provided. Note that the material itself of the banks 51 can be filled with lyophobic components (e.g., fluorine group) instead of executing the $CF_4$ plasma process and so on. Thus, the wiring pattern ink can be prevented from attaching itself to the upper surfaces of the banks, and the film pattern with a desired shape can precisely be formed by preferably dropping the wiring pattern ink into the respective wiring forming areas 52, 53, 54, and 55.

Subsequently, the wiring as the lattice like film pattern composed of the gate wiring 40, the source wiring 42, and so on is formed on the substrate P by ejecting and disposing the wiring pattern ink containing the conductive fine particles to the pattern forming areas 57 (respective wiring forming areas 52, 53, 54, and 55) with the droplet ejection device IJ described above.

In the present embodiment, the dispersion liquid described above having the conductive fine particles dispersed in the dispersion medium or a solution having organosilver compounds or silver oxide nanoparticles dispersed in the solvent (dispersion medium) is used as the wiring pattern ink. As the conductive fine particles, for example, besides fine particles of metal such as gold, silver, copper, tin, lead, fine particles of oxides of the aforementioned metals, electrically conductive polymers, or superconductive materials, and so on can be used. These conductive fine particles can also be used with an organic matter and so on applied on the surfaces in order for improving dispersibility.

Note that, although the gate wiring 40, the source wiring 42, and the gate electrodes 41 are each formed of a single layer film pattern in the present embodiment, a wiring pattern added with enhanced capabilities by stacking two or more layers of different materials can also be formed, for example.

After thus ejecting the wiring pattern ink to the pattern forming areas partitioned with the banks 51, a preliminary drying process is performed for removing the dispersion medium in the ejected wiring pattern ink and assuring the film thickness according to needs. The preliminary drying process can be realized by a lamp annealing process besides a typical heating process for directly heating the substrate P with, for examples a hot plate or an electrical heating furnace. A light source for the lamp annealing process is not particularly limited, but a infrared lamp, a xenon lamp, a YAG laser, an argon laser, a carbon oxide gas laser, or excimer laser using XeF, XeCl, XeBr, KrF, KrCl, ArF, or ArCl can be used as the light source. The light sources having the output power in a range of no less than 10W and no greater than 5000W can typically be used, but in the present embodiment, those in a range of no less than 100W and no greater than 1000W are sufficient.

If the thicknesses of the gate wiring 40, the source wiring 42, and the gate electrodes 41, which can be formed by performing the functional liquid disposing process and the preliminary drying process once, do not reach the necessary film thicknesses, the ink droplets can be stacked by repeatedly performing the ink disposing process and the preliminary drying process, thus the gate wiring 40, the source wiring 42, the gate electrodes 41, source electrodes 17, and drain electrodes 14 with sufficient film thicknesses can be formed.

By performing the preliminary drying process, as shown in FIGS. 5A and 5B, the gate wiring 40, the gate electrodes 41, and the source wiring 42 are formed in the respective wiring forming areas 52, 54, and 55.

Lyophobic Process Steps

In forming the metal protecting layer (the cap layer) covering the upper surfaces of the gate wiring 40, the gate electrodes 41, and the source wiring 42, as shown in FIG. 5C, a tyophobic process is performed on the entire surface of the substrate P including the upper surfaces of the gate wiring 40, the gate electrodes 41, the source wiring 42, and the capacitance lines 46 in addition to the upper surfaces of the banks 51.

As a method of the lyophobic process, a method of forming a self-assembly film on the surface of the substrate P, and a method of directly making the surface of the substrate P lyophobic by a plasma process using $CF_4$ (tetrafluoromethane) as a process gas can be cited. The plasma process is carried out by irradiating the substrate P with plasma under normal pressure or in vacuo. And, the gas used in the plasma process can be selected from a wide variety of gases in consideration of, for example, a surface material of the substrate P on which the wiring pattern is formed. As the process gas besides the $CF_4$ gas, for example, perfluorohexane, perfluorodecane, and so on can be exemplified. Incidentally, if the plasma process is used in performing the lyophobic process on the substrate P, the gate wiring 40, the source wiring 42, and so on formed in the pattern forming areas 57 might be damaged by the plasma.

Therefore, in the present embodiment, the method of forming a self-assembly film is adopted as the lyophobic process to the entire surface of the substrate P.

In the method of forming a self-assembly film, an organic molecular film (not shown) is firstly formed on the substrate P. The organic molecular film is composed of organic molecules having functional groups which can be bound to the surface of the substrate P and functional groups having a surface reforming function such as lyophilic groups or lyophobic groups connected via carbon chains, and can be formed by making the substrate P absorb such organic molecules evenly on the surface thereof.

Note here that the self-assembly film is composed of bonding groups capable of reacting with atoms composing a foundation layer and so on of the substrate and other linear chain molecules, and is formed by directing compounds having extremely strong orientation derived from the mutual interaction of the linear chain molecules. The self-assembly film, which is composed of oriented monomolecules, can be made extremely thin, and even on the molecular level. In other words, since the same molecules are positioned on the surface of the film, even and superior lyophobicity can be provided to the surface of the film.

By using, for example, fluoroalkylsilane as the compound having superior orientation described above, each compound is oriented so that the fluoroalkyl group is positioned on the surface of the film, thereby providing the even lyophobicity to the surface of the film.

As the compound for composing the self-assembly film, fluoroalkylsilane (hereinafter referred to as FAS) such as (heptadecafluoro-1,1,2,2-tetrahydrodecyl)triethoxysilane, (heptadecafluoro-1,1,2,2-tetrahydrodecyl)trimethoxysilane, (heptadecafluoro-1,1,2,2-tetrahydrodecyl)trichlorosilane, (tridecafluoro-1,1,2,2-tetrahydrooctyl)triethoxysilane, (tridecafluoro-1,1,2,2-tetrahydrooctyl)trimethoxysilane, (tridecafluoro-1,1,2,2-tetrahydrooctyl)trichlorosilane, trifluoropropyltrimethoxysilane can be exemplified. Each of these compounds can be used alone or in combination with one or more of these compounds. Note that, by using FAS, a lyophobic film F with strong adhesiveness, which is illustrated with chain double-dashed lines in FIG. 6A, can be formed on the entire surface of the substrate P.

FAS is generally expressed in the following constitutional formula. $RnSiX(4-n)$ In the formula, n denotes an integer no smaller than one and no greater than three, X denotes a hydrolytic group such as a methoxy group, an ethoxy group, or a halogen atom. Further, R denotes a fluoroalkyl group having the following structure. $(CF_3)(CF_2)_x(CH_2)_y$ (where, x denotes an integer no smaller than zero and no greater than ten, and y denotes an integer no smaller than zero and no greater than four) If a plurality of R or X is bound to Si, the plurality of R or X can be the same or different from each other. The hydrolytic group expressed in X is hydrolyzed to form silanol, which reacts with a hydroxyl group in the foundation of the substrate P (glass or silicon) to be bound to the substrate P with siloxane bond. Meanwhile, since R is provided with a fluoro group such as $(CF_2)$ on the surface thereof, R reforms the surface of the foundation of the substrate P to be a surface difficult to wet (having lower surface energy).

The self-assembly film is formed on the substrate P by leaving the material compound described above and the substrate P encapsulated in the same airtight container at room temperature for two or three days. Alternatively, by keeping the airtight container at 100° C., it can be formed on the substrate P in about three hours. Although these methods described above are formation methods in the gaseous phase, the self-assembly film can be formed in the liquid phase. For example, by dipping the substrate P in the solution containing the material compound, and then cleaning and drying it, the self-assembly film can be formed on the substrate P. It is desirable to execute a preparation on the surface of the substrate P prior to forming the self-assembly film by, for example, irradiating the surface of the substrate P with ultraviolet light or cleaning the substrate P with the solvent.

Note here that FIGS. 6A and 6B show side cross-sectional views along the A-A' line in FIG. 4A, while FIG. 6C shows a plan view of the substrate P corresponding to FIG. 4A.

After thus providing lyophobicity to the entire surface of the substrate P by the self-assembly film forming method as shown in FIG. 6A, the lyophobicity of the substrate P is weakened while selectively maintaining the lyophobicity in predetermined positions on the respective upper surfaces of the source wiring 42 formed in the condition divided by the gate wiring 40 and capacitance lines 46. Note here that the predetermined positions denote the positions where the conductive films 49 for connecting between the divided source wiring pattern 42 are to be provided by a step described later. Hereinafter, the explanations will be presented referring to the predetermined positions as conductive film connecting sections 37. As described above, since the entire surface of the substrate P is in a condition provided with the lyophobicity with the lyophobic film F formed with FAS, in order for selectively maintaining the lyophobicity in the conductive film connecting sections 37, a mask M having a shape for blocking ultraviolet light irradiating the conductive film connecting section 37 is used as shown in FIG. 6B. And, the substrate P is irradiated with ultraviolet light with a wavelength of, for example, 170 through 400 nm.

Thus, in the area except the conductive film connecting sections 37 of the substrate P is directly irradiated with the ultraviolet light without blocking the ultraviolet light by the mask M. Accordingly, as shown in FIG. 6C, the condition can be realized in which the lyophobicity is maintained only in the conductive film connecting sections 37 of the source wiring 42 while making the lyophobicity weak in other area than the conductive film connecting sections 37. Note that the extent to which the lyophobicity is weakened can be controlled by the irradiation time of the ultraviolet light, or alternatively, by the strength and the wavelength of the ultraviolet light, combination with a thermal process (a heating process) and so on.

Further, by using, for example, a halftone mask as the mask M, a dose of ultraviolet radiation applied on a part of the source wiring 42 except the conductive film connecting sections 37, the gate wiring 40, the capacitance lines 46, and the drain electrodes 41 is increased with respect to the ultraviolet radiation applied on the banks 51, thereby controlling the strength of the lyophobicity to a desired condition.

In this case, the wettability of the upper surfaces of the gate wiring 40, the source wiring 42, and the capacitance lines 46 preferably corresponds to the lyophobicity with which the metal protecting layer forming material to be ejected thereto can wet and extend on the surfaces. Further, the lyophobicity of the upper surfaces of the banks 51 preferably has strength enough to repel the metal protecting layer forming material (a functional liquid) landing on the banks 51 when forming the metal protecting layer described later by the droplet ejection method.

By thus arranging the lyophobicity, when the metal protecting layer is disposed in the pattern forming areas 57, even if the metal protecting layer forming material lands on the banks, the lyophobicity remaining on the upper surfaces of the banks 51 can surely drop the material inside the pattern forming areas 57.

Metal Protecting Layer Forming Steps

FIGS. 7A through 7C are schematic views for explaining the steps of stacking the metal protecting layer (the cap layer) 42 on the source wiring 42 and the gate wiring 40. Note that FIGS. 7A and 7B are schematic views for showing the substrate P corresponding to the cross-section along the A-A' line in FIG. 4A, and FIG. 7C is a plan view of the substrate P provided with the metal protecting layer 42.

Firstly, as shown in FIG. 7A, the metal protecting layer forming material 47a is disposed on the respective wiring 40, 41, 42, and 46 using the droplet ejection device IJ. In this step, as the metal protecting layer forming material 47a, a material using Ni (nickel) as the conductive fine particles, and water and diethanolamine as the solvent (dispersion medium) is ejected to be disposed thereon. Note that as the conductive fine particles, Ti, W, Mn besides Ni, or alloys composed mainly of these metals can also be used.

In this case, since the lyophobicity as strong as to at least repel the metal protecting layer forming material 47a is provided on the upper surfaces of the banks 51 as described above, it can preferably be dropped inside the pattern forming areas 57 in which the wiring patterns 40, 41, 42, and 46 are formed.

Further, the lyophobicity on the surfaces of the wiring patterns 40, 41, 42, and 46 is in condition in which the metal protecting layer forming material 47a can wet and extend thereon. However, since the lyophobic film F is formed, as described above, on each of the conductive film connecting sections 37 in the source wiring 42 to which the conductive film is to be connected in the step described later, the metal protecting layer forming material 47a is repelled, and accordingly, the metal protecting layer 47 is never stacked on each of the conductive film connecting sections 37.

After ejecting the metal protecting layer forming material 47a, a drying process is performed for removing the dispersion medium according to needs. The drying process can be carried out by a typical heating process for heating the substrate P with, for example, a hot plate or an electrical heating furnace. The process conditions includes, for example, heating temperature of 180° C., and heating time of about 60 minutes. The heating process is not necessarily performed in the atmosphere, but can be performed under nitrogen atmosphere.

Further, the drying process can be carried out with a lamp annealing process. As a light source used for the lamp annealing process, those cited in the preliminary drying steps after the first electrode layer forming steps can be used. Further, the power in the heating step can similarly be set in the range of 100W through 1000W.

Note that, after the ejection step, the dispersion medium needs to be completely removed from the metal protecting layer 47 to enhance the adhesiveness between the fine particles. Further, if a coating material such as an organic material is applied on the surfaces of the conductive micro particles for improving dispersibility in the liquid, it is also necessary to remove the coating material. Therefore, a thermal treatment and/or a light treatment are executed on the substrate on which the ejection process is executed.

Although the thermal process and/or the optical process are usually executed in the atmosphere, they can also be executed in an environment with an inactive gas such as nitrogen, argon, or helium according to needs. The process temperature of the thermal treatment and/or the light treatment is appropriately determined in consideration of the boiling point (the vapor pressure) of the dispersion medium, the nature or pressure of the ambient gas, thermal behavior of the fine particles such as dispersibility or oxidation property, presence or absence or an amount of the coating material, an allowable temperature limit of the base member, and so on.

According to the steps described above, the adhesiveness between the fine particles is ensured in the dried film after the ejection step, and as shown in FIGS. 7B and 7C, the metal protecting layer 47 is formed on the area with no lyophobic film F formed thereon, namely the source wiring 42 except the conductive film connecting sections 37, the gate wiring 40, and the capacitance lines 46.

According to the steps described above, the lyophobic film F can be removed by performing ultraviolet irradiation or a combination of ultraviolet irradiation with a thermal treatment (heating process) after forming the metal protecting layer 47.

By thus covering the gate wiring 40, source wiring 42, and the capacitance lines 46 with the metal protecting layer 47, diffusion of metal ions can be prevented, thereby preferably operating the TFT electrically connected to these wiring patterns 40, 42, and 46.

Incidentally, the conductivity of the metal protecting layer 47 is lower in comparison with the conductivity of the source wiring 42. Therefore, if the metal protecting layer 47 covers the entire surface of the source wiring 42, it is necessary to remove a part of the metal protecting layer 47 by, for example, an etching process in forming the conductive films for providing electrical connection between the source wiring patterns, thereby exposing the source wiring 42 therefrom.

In the method of forming a film pattern according to the embodiment of the invention, it is arranged that, by selectively maintaining lyophobicity in the conductive film connecting sections 37 of the source wiring 42 on which the conductive film is formed, the metal protecting layer 47 is previously prevented from being formed on those sections. Therefore, the step of removing the metal protecting layer 47 from the conductive film connecting sections 37 can be eliminated when forming the conductive film described later. As described above, in connecting between the source wiring patterns 42 formed in a divided condition with the conductive films, it is possible to electrically connect between the source wiring patters 42 directly with the conductive films without removing the metal protecting layer 47 from the conductive film connecting sections 37.

Layered Section Forming Steps

Subsequently, as shown in FIGS. 8A and 8B, another wiring layer is formed on the film pattern such as the gate wiring 40 and the source wiring patterns 42 in the divided condition formed in the steps described above. In this step, if the lyophilicity of the surfaces of the banks 51 is not sufficient, the functional liquid for forming electrodes is repelled by the banks 51. Therefore, in the case in which the source electrodes are to be formed directly on the surfaces of the banks 51, it is difficult to form a preferable film patters thereon. Accordingly, prior to forming the source electrodes and so on, the lyophobicity of the surfaces of the banks 51, which form the foundation, is weakened by ultraviolet irradiation or the like to form a condition in which sufficient lyophilicity is provided to the surfaces.

After providing lyophilicity to the surfaces of the banks 51, as shown in FIGS. 8A and 8B, an insulating film 31, an active layer 32, and a contact layer 33 are continuously formed on the entire surface of the substrate P by a plasma CVD method. Note here that FIG. 8A shows a plan view of the substrate P, and FIG. 8B shows a cross-sectional view along the A-A' line in FIG. 5A.

In this case, the source wiring 42 with no metal protecting layer formed thereon forms a recess with respect to the banks 51. In this case, since the insulating film 31 is formed along the inner wall surface of the recess, the upper surface thereof does not become a flat surface in a strict sense. However, in the present embodiment, for the sake of simple explanations, it is assumed that the insulating film 31 is formed so as to fill in the recess section to make the upper surface of the substrate P flat by appropriately controlling the conditions of the CVD method. Specifically, as shown in FIG. 8, a silicon nitride film is used as the insulating film 31, and an amorphous silicon film as the active layer 32 and an n⁺type silicon film as the contact layer 33 are continuously formed on the surface thus planarized with the insulating film using a plasma CVD method while changing the material gas and the plasma condition.

Subsequently, as shown in FIG. 9A, resists 58a, 58b, and 58c are disposed on intersections 56 of the gate wiring patterns 40 and the source wiring patterns 42, the gate electrodes 41, and the capacitance lines 46, respectively, using a photolithography method. Note here that FIGS. 9B, 10B, and 11B are cross-sectional views along the A-A' lines in FIGS. 9A, 11A, and 11A, respectively, and FIGS. 9C, 10C, and 11C are cross-sectional views along the B-B' lines in FIGS. 9A, 10A, and 11A, respectively. Note also that the resist 58a disposed on each of the intersections 56 and the resist 58b disposed on each of the capacitance lines 46 are formed so as not to contact each other. Further the resist 58c, which is disposed on the gate electrode 41, is provided with a groove 59 as shown in FIG. 9B by performing half-exposure. Further, FIGS. 9C, 10C, and 11C, show the conductive film connecting sections 37 of the source wiring pattern 42 divided by the capacitance lines 46. The conductive film connecting sections 37 of the source wiring pattern 42 divided by the gate wiring pattern 40 have the same structures, and accordingly, are omitted from the drawings.

Subsequently, an etching process is executed on the entire surface of the substrate P to remove the contact layer 33 and the active layer 32. Moreover, another etching process is executed thereon to remove the insulating film 31.

Thus, as shown in FIGS. 10A through 10C, the contact layer 33, the active layer 32, the insulating layer 31 are removed from other areas than the area on which the resists 58 (58a, 58b, or 58c) are disposed. Meanwhile, in the predetermined areas having the resists 58 disposed thereon, there are formed layered sections 35 each composed of the insulating film 31 and a semiconductor film (the contact layer 33, the active area 32). In this case, as shown in FIGS. 10A through 10C, the condition described above is created in which the conductive film connecting sections 37 with no metal protecting layer 47 formed thereon are exposed.

Note that in the layered sections 35 formed on the gate electrodes 41, since the grooves 59 are provided to the resists 58c by executing the half-exposure, the grooves run through the resists 58c to divide them by performing development again prior to the etching process. As shown in FIG. 10B, the contact layer 33 corresponding to the groove 59 is removed, and the contact layer 33 is formed so as to be divided into two. Accordingly, the TFT 30 as a switching element composed of the active layer 32 and the contact layer 33 is formed on the gate electrode 41.

And, as shown in FIGS. 11A through 11C, the silicon nitride film as a protective film 60 for protecting the contact layer 33 is formed on the entire surface of the substrate P.

Pixel Electrode Forming Steps

FIGS. 12A through 12C, 13A through 13C, 14A through 14C, and 15A through 15C are schematic views for explaining steps of forming pixel electrodes and so on. Note that FIGS. 12B, 13B, 14B, and 15B are cross-sectional views along the A-A' lines in FIGS. 12A, 13A, 14A, and 15A, respectively, and FIGS. 12C, 13C, 14C, and 15C are cross-sectional views along the B-B' lines in FIGS. 12A, 13A, 14A, and 15A, respectively. Note also that, FIGS. 12C, 13C, 14C, and 15C show the conductive film connecting sections 37 of the source wiring pattern 42 divided by the capacitance lines 46. The conductive film connecting sections 37 of the source wiring pattern 42 divided by the gate wiring pattern 40 have the same structures, and accordingly, are omitted from the drawings.

In the present step, the source electrodes 43, the drain electrodes 44, the conductive films 49, and the pixel electrodes 45 are formed.

The source electrodes 43, the drain electrodes 44, and the conductive films 49 can be formed from the same material as the material for forming the gate wiring 40 and the source wiring 42. The pixel electrodes, which need to be transparent, are preferably formed with a translucent material such as indium tin oxide (ITO). Similarly to the steps for forming the gate wiring 40, the source wiring 42, and so on, the droplet ejection method is used for forming these elements.

Firstly, as shown in FIG. 12A, banks 61 covering the gate wiring 40, the source wiring 42, the capacitance lines 46 are formed according to a photolithography method. Namely, as shown in FIGS. 12A through 12C, the banks 61 substantially shaped like a lattice are formed. Note that an opening 62 is provided to each of the intersections 56 of the source wiring patterns 42 and the gate wiring patterns 40, and each of the intersections 56 of the source wiring patterns 42 and the capacitance lines 46, and an opening 63 is provided to each position corresponding to the drain region of the TFT 30.

Further, as shown in FIG. 12B, each of the openings 62 and 63 are formed so that a part of the layered section 35 (TFT 30) formed on the gate electrode 41 is exposed therefrom. Namely, the bank 61 is formed so as to divide the layered section 35 (TFT 30) into two in the X direction shown in FIG. 12A.

As a material for composing the banks 61, for example, as is the case with the banks 51, an inorganic material composed principally of polysilazane can be used, or alternatively, a polymeric material such as acrylic resin, polyimide resin, olefin resin, or melamine resin can also be used. In order for preferably disposing the ink, the surfaces of the banks 61 are preferably provided with lyophobicity. Consequently, a material previously filled with lyophobic components (e.g., fluorine group) itself can be used for the banks 61.

Note here that, the opening 62 composed of the banks 61 corresponds to the conductive film for linking the divided source wiring pattern 42 or to a position where the source electrode is formed (see FIGS. 15A through 15C). Further, the opening 63 provided to the banks 61 corresponds to a position where the drain electrode is formed (see FIGS. 15A through 15C). Still further, areas surrounded by the banks 61 in other sections than the above correspond to positions where the pixel electrodes are formed. Namely, by disposing a conductive material to the inside of the openings 62 and 63 in the banks 61 and the areas surrounded by the banks 61, the conductive films for linking the divided source wiring patterns 42, the source electrodes, the drain electrodes, and the pixel electrodes are formed.

Subsequently, the protective film 60 formed on the entire surface of the substrate P is removed by an etching process. Thus, as shown in FIGS. 13A through 13C, the protective film 60 formed on areas with no banks 61 disposed thereon is removed.

In this case, since the metal protecting layer 47 is not formed in the conductive film connecting sections 37, the source wiring 42 can be exposed inside the openings 62 without performing another etching step for removing the metal protecting layer 47 after etching the protective film 60 exposed through the banks 61. Therefore, the steps for electrically connecting between the divided source wiring patterns 42 can be simplified.

Subsequently, as shown in FIGS. 14A through 14C, electrode forming ink including an electrode material for the source electrodes 43, the drain electrodes 44, and so on is ejected and disposed in the openings 62 and 63 in the banks 61 with the droplet ejection device IJ described above. The same ink as the wiring pattern ink used for forming the gate wiring 40 and so on can be used as the electrode forming ink. After ejecting the electrode forming ink to the substrate P, a drying process and a calcining process are performed for removing the dispersion medium according to needs. By the drying process and the calcining process, the electrical contact between the conductive fine particles is obtained, and the material is transformed to a conductive film.

Note that, although in the drawings, the source electrodes 43 and the drain electrodes 44 are each assumed to be a single layer, each of these electrodes can be a layered film composed of a plurality of layers. These layers can sequentially be formed by repeatedly performing the material disposing step and the preliminary drying process.

Through the steps described above, as shown in FIGS. 14A through 14C, the conductive films 49 for linking the divided source wiring patterns 42, the source electrodes 43, the drain electrodes 44 are formed on the substrate P.

As described above, in the present embodiment, prior to forming the wiring layers (the source electrodes 43, the drain electrodes 44, and the pixel electrodes 45) in the upper layer side, the surfaces of the banks 51 forming the foundation thereof are provided with lyophilicity. Therefore, the wettability of the banks 51 to the ink (functional liquid) to form wiring can be enhanced, thus an even wiring pattern can be formed.

Note that, although not shown in the drawings, the source wiring patterns 42 divided by the gate wiring pattern 40 are also in a condition of being electrically connected to each other via the conductive films 49. Therefore, the source wiring 42 functions as a continuous film pattern with the help of the conductive films 49.

Subsequently, in the banks 61, parts 61a thereof positioned in the boundaries between the pixel electrodes 45 and the drain electrodes 44 are removed by laser irradiation or the like, pixel electrode forming ink including electrode material for the pixel electrodes 45 is ejected and disposed in the areas surrounded by the banks 61. The pixel electrode forming ink is a dispersion liquid having conductive fine particles made of ITO or the like dispersed in a dispersion medium. After ejecting the pixel electrode forming ink to the substrate P, a drying process and a calcining process are performed for removing the dispersion medium according to needs. By the drying process and the calcining process, the electrical contact between the conductive fine particles is obtained, and the material is transformed to a conductive film.

Through the steps described above, as shown in FIGS. 15A through 15C, the pixel electrodes 44 electrically connected to the drain electrodes 44 are formed on the substrate P.

Note that, although the banks 61 are partially removed by the laser irradiation or the like in the boundary sections between the drain electrodes 44 and the pixel electrodes 45 to electrically connect these electrodes 44 and 45, the present step is not limited to this configuration. For example, by previously thinning the part of the bank 61 corresponding to the boundary section using the half-exposing or the like, the pixel electrode forming ink can be ejected and disposed so as to overlap the drain electrode 44 without removing the bank 61 in this section.

Though the above steps, the active matrix substrate 20 is manufactured.

According to the present embodiment, the metal protecting layer 47 is not formed on the conductive film connecting sections 37 in the source wiring pattern 42 formed in the divided condition. Since the cap layer is not stacked in the predetermined positions as described above, in the case in which a conductive film for providing connection between divided second film patterns is formed, the second film patterns can electrically be connected with the conductive film without performing a conventional step of removing the cap layer covering the film pattern to which the conductive film is to be formed.

Since the metal protecting layer 47 is not stacked on the conductive film connecting sections 37 as described above, in the case in which the divided source wiring patterns 42 are connected by the conductive films 39, by eliminating the step of removing the metal protecting layer 47 by etching when providing electrical connection between the source wiring patterns 42, the step of forming the source wiring 42 can be simplified, thereby enhancing the productivity of the active matrix substrate equipped with the TFT 30 electrically connected to the source wiring 42.

Note that, although in the present embodiment, one of preferable embodiments of the active matrix substrate is explained, the shapes or the combinations of the configuration elements are not limited to the embodiment. For example, although the configuration is explained in which the source wiring pattern 42 is divided in the intersection 56 with the gate wiring 40, it can be applied to a configuration equipped with the capacitance lines besides the gate wiring 40. In this case, although the source wiring patterns 42 are in a condition divided by the gate wiring patterns 42 and the capacitance lines, by forming the conductive sections for providing electrical connection to each of the intersections using the method of forming a film pattern according to the invention, the steps can be simplified, and at the same time, the productivity can also be enhanced.

Electro-Optic Device

A liquid crystal display device 100 as an example of an electro-optic device equipped with the active matrix substrate 20 obtained by the manufacturing process described above will now be explained.

Figure 16:
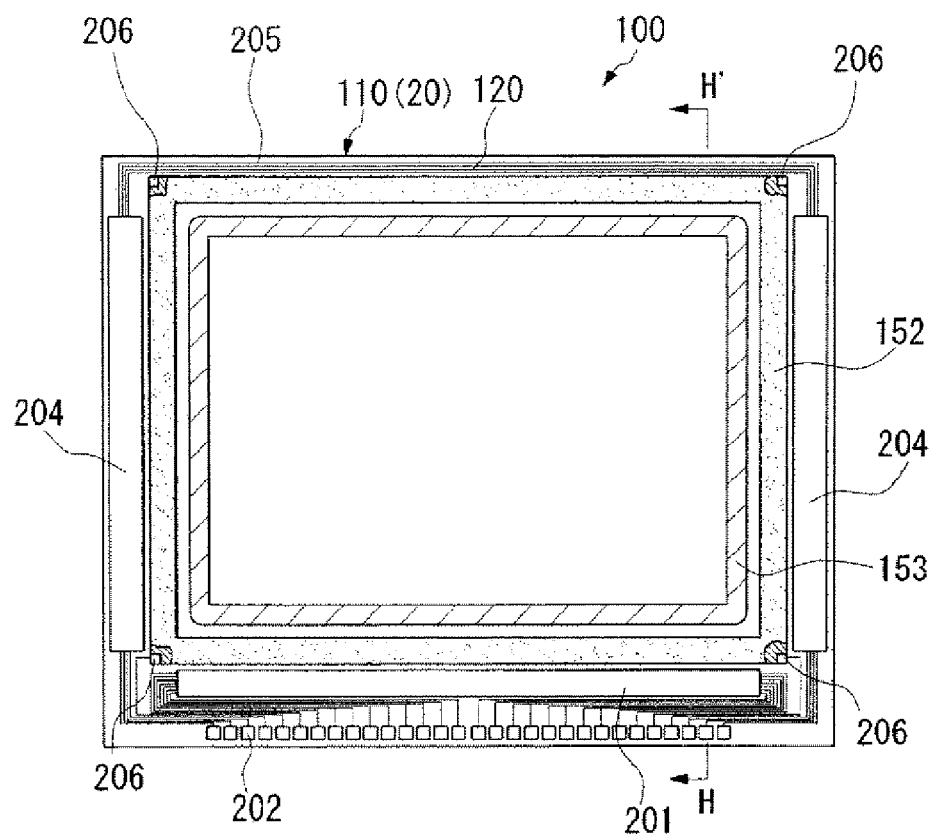
FIG. 16 is a plan view of a liquid crystal display device seen from an opposed substrate.
Figure 17:
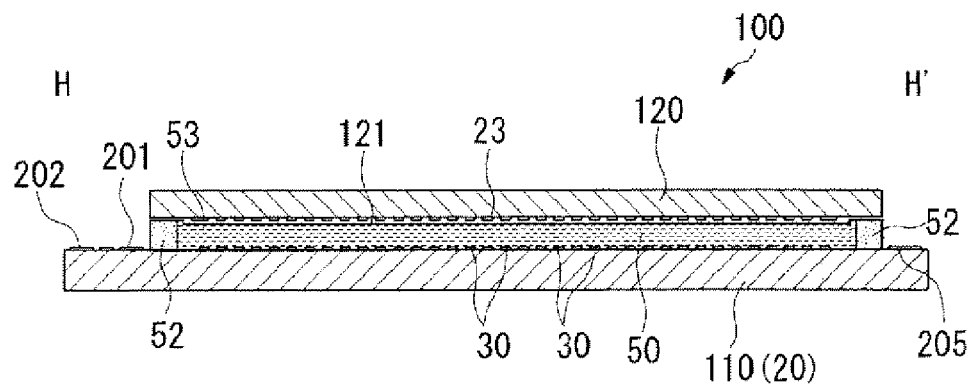
FIG. 17 is a cross-sectional view of a liquid crystal display device.

FIG. 16 is a plan view of the liquid crystal display device 100 seen from the opposing substrate side, and FIG. 17 is a cross-sectional view along the H-H' line in FIG. 16.

Note that the scale ratios of the various layers and the various members may be set differently in the drawings used in the description below in order for illustrating the various layers and the various members in visible sizes on the drawings.

In FIGS. 16 and 17, the liquid crystal display device (electro-optic device) 100 has a structure in which the TFT substrate 110 including the active matrix substrate 20 and the opposing substrate 120 are adhered to each other with a seal member 152, the light curing sealant, and the liquid crystal 150 is encapsulated and held in the region partitioned with the seal member 152. The seal member 152 is formed in the area inside the surface of the substrate as a closed frame, not provided with a fill port of the liquid crystal, and is configured so as not to show a sign of sealing with a seal member.

Inside an area in which the sealing member 152 is formed, there is provided a periphery cover 153 made of a light blocking material. In the outer area of the sealing member 152, there are provided a data line drive circuit 201 and mounting terminals 202 along one side of the TFT array substrate 110, and scanning line drive circuits 204 are formed along two sides adjacent to the one side. In the remaining side of the TFT array substrate 110, there is provided a plurality of wiring 205 patterns for connecting the scanning line drive circuits 204 to each other, which are provided on the both sides of the image display area. Further, on at least one corner of the opposing substrate 120, there is provided an inter-substrate connecting member 206 for achieving electrical connection between the TFT array substrate 110 and the opposing substrate 120.

Note that, it can be arranged that instead of forming the data line drive circuit 201 and the scanning line drive circuits 204 on the TFT array substrate 110, for example, a tape automated bonding (TAB) substrate is electrically and mechanically connected to a group of terminals provided to the periphery of the TFT array substrate 110 via an anisotropic conductive film.

Further, although in the liquid crystal display device 100, a wave plate, a deflecting plate, and so on are disposed in appropriate orientations in accordance with a nature of the liquid crystal 150 used therein, namely the operational mode such as a twisted nematic (TN) mode, C-TN method, VA method, or IPS mode, or which one of normally white mode and normally black mode is selected, the illustration thereof will be omitted here.

Further, if the liquid crystal display device 100 is configured to be used as a color display, color filters for red (R), green (G), and blue (B), for example, are formed with their protective films in the area of the opposing substrate 120 facing the respective pixel electrodes, which are described below, of the TFT array substrate 110.

Figure 18:
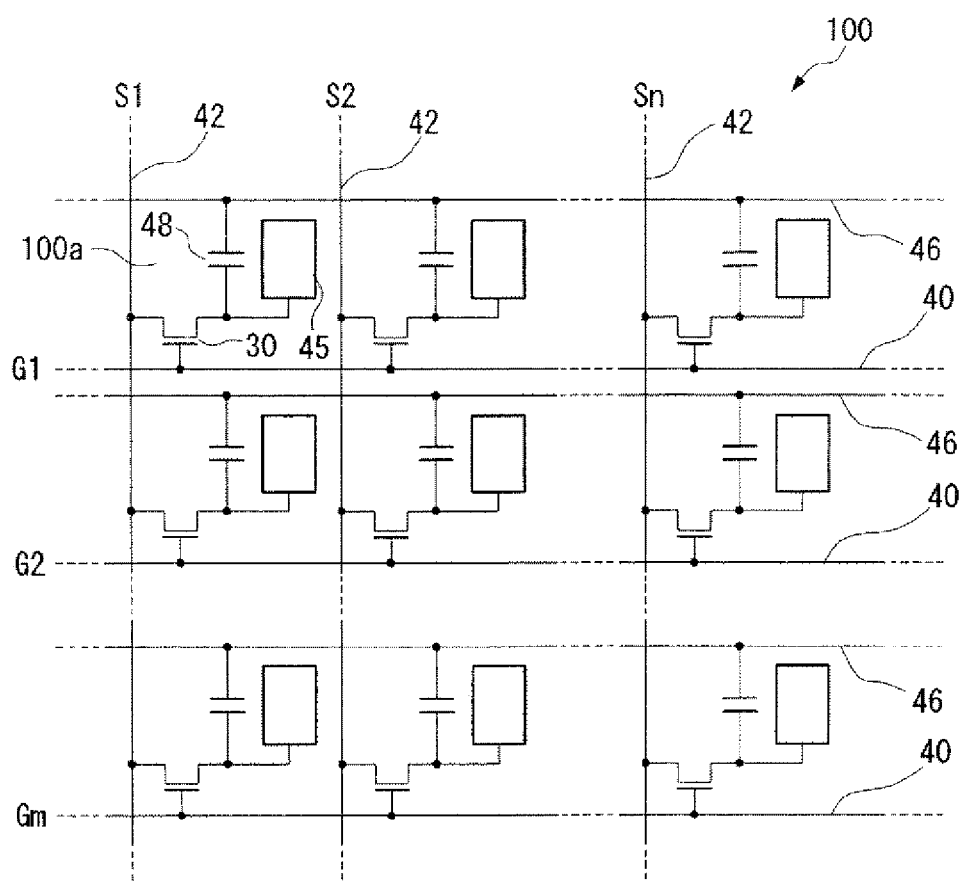
FIG. 18 is a diagram showing an equivalent circuit of the liquid crystal display device

In the image display area having such a structure, as shown in FIG. 18, a plurality of pixels 10a is configured as a matrix, and each of the pixels 100a is provided with a TFT (a switching device) 30 for pixel-switching, and the data line 42 for supplying a pixel signal S1, S2, . . . , or Sn is electrically connected to the source of the TFT 30. The pixel signals S1, S2, . . . , Sn to be written to the data lines 42 can be supplied to the data lines 42 in this sequential order. Alternatively, every group of these signals is supplied to a plurality of data lines 42 adjacently located. Further, the scanning lines 40 are electrically connected to the gates of the TFTs 30, and it is configured that the scanning signals G1, G2, . . . , Gm are respectively supplied to the scanning lines 40 at a predetermined timing in forms of pulses in this order.

The pixel electrode 45 is electrically connected to the drain of the TFT 30. The TFT 30 as a switching element is turned on during a predetermined period of time, thereby writing Image signals S1, S2, . . . , Sn supplied from the data lines 42 to the respective pixels with predetermined timing. According to this operation, the image signals S1, S2, . . . , Sn of predetermined levels stored in the liquid crystal via the pixel electrodes 45 are held between the pixel electrodes and the opposing electrodes 121 of the opposing substrate 120 shown in FIG. 17 for a predetermined period of time. Note that, in order for preventing leakage of the pixel signals S1, S2, . . . , Sn held therebetween, storage capacitors 48 are additionally provided in parallel with the liquid crystal capacitors formed between the pixel electrodes 45 and the opposing electrodes 121. For example, the voltages of the pixel electrodes 45 are held by the storage capacitors 48 for about thousand times as long as the period for applying the source voltages. Accordingly, the charge holding performance is improved, thus the liquid crystal display device 100 having a high contrast ratio can be realized.

FIG. 18 shows an equivalent circuit diagram composing the liquid crystal device 100.

In the case in which the active matrix substrate 20 is used for the liquid crystal display device 100, there is formed a plurality of pixels 100a in a matrix in the image display area. Each of the pixels 100a is provided with the TFT 30 for switching the pixel, and the source wiring 42 for supplying the pixel signals S1, S2, . . . , Sn is electrically connected to the source of the TFT 30 via the source electrode 43. The pixel signals S1, S2, . . . , Sn to be supplied to the source wiring 42 can be supplied to the source wiring 42 in this sequential order. Alternatively, every group of these signals is supplied to a plurality of source wiring patterns 42 adjacently located.

Further, the gate wiring 40 is electrically connected to the gate of the TFT 30 via the gate electrode 41. And, it is configured that the scanning signals G1, G2, . . . , Gm are applied to the gate wiring 40 as pulses in this sequential order with predetermined timing.

The pixel electrodes 45 are electrically connected to the drains of the TFTs 30 via the drain electrodes 44, respectively. And, the TFT 30 as a switching element is turned on during a predetermined period of time, thereby writing image signals S1, S2, . . . , Sn supplied from the source wiring 42 to the respective pixels with predetermined timing. According to this operation, the image signals S1, S2, . . . , Sn of predetermined levels stored in the liquid crystal via the pixel electrodes 45 are held between the pixel electrodes and the opposing electrodes 121 of the opposing substrate 120 shown in FIG. 17 for a predetermined period of time.

Note that, in order for preventing leakage of the pixel signals S1, S2, . . . , Sn held therebetween, storage capacitors 48 are additionally provided via the capacitance lines 46 in parallel with the liquid crystal capacitors formed between the pixel electrodes 45 and the opposing electrodes 121. Note here that the structure in which the source wiring patterns 42 are divided by the capacitance lines 46 can be adopted. For example, the voltages of the pixel electrodes 45 are held by the storage capacitors 48 for about thousand times as long as the period for applying the source voltages. Accordingly, the charge holding performance is improved, thus the liquid crystal display device 100 having a high contrast ratio can be realized.

Further, the active matrix substrate 20 described above can be applied to other electro-optic devices than the liquid crystal display device such as an organic electroluminescence (EL) display device. The organic EL display device is an element having a structure, in which a thin film including an inorganic or an organic fluorescent compound is sandwiched by a cathode and an anode, and generating excitons by injecting electrons and holes to the thin film and exciting them, and emitting light utilizing emission (fluorescence or phosphorescence) of light caused by recombination of the excitons. And, a light-emitting full-color EL device can be manufactured by respectively patterning on the substrate provided with TFTs 30 described above using ink of the light emitting layer forming materials, namely materials respectively presenting red, green, and blue selected from the fluorescent materials used for organic EL display elements, and ink of a material for forming a hole injection/electron transport layer Such an organic EL device is also included in the scope of the electro-optic device according to the invention.

Further, the active matrix substrate 20 can also be applied to a plasma display panel (PDP), or a surface-conduction electron-emitter display, which utilizes a phenomenon of generating electron emission by making current flow in parallel with the surface of a thin film having the small area provided on the substrate.

According to the liquid crystal display device 100 according to the embodiment of the invention, since the step of forming the source wiring 42, which is electrically connected to the TFT 30 and formed in the divided condition, can be simplified, the productivity of the active matrix substrate itself can be enhanced. Since the liquid crystal display device 100 is equipped with the active matrix substrate 20 with high productivity, the productivity of the liquid crystal display device 100 itself is also increased, thus the cost reduction can be expected.

Electronic Apparatus

Specific examples of an electronic apparatus according to the invention are hereinafter described.

Figure 19:
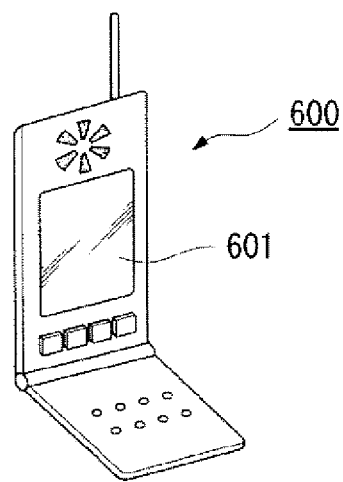
FIG. 19 is a schematic view showing a specific example of an electronic apparatus.

FIG. 19 is a perspective view showing an example of a mobile phone. In FIG. 19, the reference numeral 600 denotes a main body of the mobile phone, and the reference numeral 601 denotes a liquid crystal display section equipped with the liquid crystal display device according to the above embodiment.

Since the mobile phone 600 shown in FIG. 19 is equipped with the electro-optic device with high productivity and reduced cost, the electronic apparatus itself equipped with the electro-optic device also becomes to have high productivity and reduced cost.

Note that, although the electronic apparatuses according to the present embodiment are described as being equipped with the liquid crystal display device, they can be electronic apparatuses equipped with another electro-optic device such as an organic electroluminescence display device or a plasma display device.

Note also that the invention can also be applied to other various electronic apparatuses than described above. The invention can also be applied to, for example, liquid crystal projectors, multimedia personal computers (PC), engineering work stations (EWS), pagers, word processors, televisions, video cassette recorders of viewfinder types or direct monitor types, personal digital assistants, electric calculators, car navigation devices, POS terminals, apparatuses equipped with a touch panel and so forth.

Although the explanation is presented as above regarding the preferable embodiments of the invention with reference to the accompanying drawings, it is obvious that the invention is not limited to such embodiments. The various shapes and combinations of the configuration elements presented in the embodiments are provided for exemplification only, and can be modified in various ways within the spirit or scope of the invention in accordance with design needs and so on.

What is claimed is:

1. A method of forming a film pattern, comprising:

forming a bank for partitioning a pattern forming area including a first pattern forming area and a second pattern forming area having an intersection with the first pattern forming area and divided in the intersection into sub-areas;

disposing a functional liquid to the first pattern forming area to form a first film pattern, and disposing a functional liquid to the sub-areas to form second film patterns;

executing a lyophobic process on the entire surface of a substrate including the first film pattern, the second film patterns, and the bank;

weakening the lyophobicity on the substrate while selectively maintaining the lyophobicity on predetermined positions of the respective second film patterns formed in a divided condition after executing the lyophobic process;

stacking a cap layer on the first film pattern and the second film patterns after weakening the lyophobicity;

removing the lyophobicity in the predetermined positions of the respective second film patterns formed in the divided condition after stacking the cap layer; and forming a conductive film between the predetermined position of one of the second film patterns and the predetermined position of another of the second film patterns to electrically connect the second film patterns formed in the divided condition.

2. The method of forming a film pattern according to claim 1, wherein the weakened lyophobicity in a upper surface of the bank is as strong as to at least repel a functional liquid, which forms the cap layer, disposed on the bank.

3. The method of forming a film pattern according to claim 1, wherein a material for forming the bank includes an inorganic material composed principally of one of polysilazane, polysilane, and polysiloxane as solid content.

4. The method of forming a film pattern according to claim 1, wherein, in the lyophobic process, a self-assembly film is formed on the entire surface of the substrate including the first film pattern, the second film patterns, and the bank.

* * * * *